US012548482B2

(12) United States Patent
Yin et al.

(10) Patent No.: US 12,548,482 B2
(45) Date of Patent: Feb. 10, 2026

(54) CONTROL METHOD AND CONTROL DEVICE FOR CURRENT DETECTION APPARATUS

(71) Applicant: BOE TECHNOLOGY GROUP CO., LTD., Beijing (CN)

(72) Inventors: Xinshe Yin, Beijing (CN); Hualing Yang, Beijing (CN); Xinbin Han, Beijing (CN); Guangliang Shang, Beijing (CN); Jianchao Zhu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 4 days.

(21) Appl. No.: 18/573,754

(22) PCT Filed: Jun. 25, 2021

(86) PCT No.: PCT/CN2021/102523

§ 371 (c)(1),
(2) Date: Dec. 22, 2023

(87) PCT Pub. No.: WO2022/267050

PCT Pub. Date: Dec. 29, 2022

(65) Prior Publication Data

US 2024/0290233 A1 Aug. 29, 2024

(51) Int. Cl.

| | |
|---|---|
| ***G09G 3/00*** | (2006.01) |
| ***G01R 19/25*** | (2006.01) |
| ***G09G 3/3233*** | (2016.01) |

(52) U.S. Cl.
CPC ......... *G09G 3/006* (2013.01); *G01R 19/2509* (2013.01); *G09G 3/3233* (2013.01);
(Continued)

(58) Field of Classification Search
None
See application file for complete search history.

(56) References Cited

U.S. PATENT DOCUMENTS 9,685,119 B2 * 6/2017 Kim ........................ G09G 3/006
11,588,993 B2 * 2/2023 Lee ....................... G09G 3/3291
(Continued)

FOREIGN PATENT DOCUMENTS

CN 104424893 A 3/2015
CN 105206208 A 12/2015
(Continued)

*Primary Examiner* — Brian M Butcher
(74) *Attorney, Agent, or Firm* — BROOKS KUSHMAN P.C.

(57) ABSTRACT

A control method and a control device for a current detection apparatus are provided, which are used to improve the accuracy of current detected by the current detection apparatus. A sensing control switch is controlled to be in an on state at a first time point before an integration operation is performed on the detection line; a current detection circuit is controlled to start the integration operation on a current of a detection line at the integration start time point to obtain an integrated voltage signal corresponding to the detection line; multiple samplings are performed on the integrated voltage signal, and an output voltage difference between different sampling points is determined; and the current of the detection line is determined based on the output voltage difference.

18 Claims, 12 Drawing Sheets

(52) U.S. Cl.
CPC ............... *G09G 2300/0819* (2013.01); *G09G 2300/0842* (2013.01); *G09G 2320/0233* (2013.01)

(56) References Cited

U.S. PATENT DOCUMENTS

| | | | |
|---|---|---|---|
| 2015/0061981 | A1 | 3/2015 | Lee et al. |
| 2015/0379909 | A1 | 12/2015 | Yu et al. |
| 2015/0379937 | A1 | 12/2015 | Kim et al. |
| 2016/0012798 | A1 | 1/2016 | Oh et al. |
| 2018/0114815 | A1 | 4/2018 | Lee et al. |
| 2018/0254006 | A1 | 9/2018 | Hwang et al. |
| 2018/0308428 | A1 | 10/2018 | Chen et al. |
| 2019/0147781 | A1 | 5/2019 | Park |
| 2020/0106976 | A1 | 4/2020 | Lee et al. |
| 2020/0175921 | A1 | 6/2020 | Choi et al. |
| 2020/0202787 | A1 | 6/2020 | Do et al. |
| 2021/0043148 | A1 | 2/2021 | Lee et al. |
| 2022/0068198 | A1 | 3/2022 | Yang et al. |
| 2022/0366850 | A1 | 11/2022 | Ji et al. |

FOREIGN PATENT DOCUMENTS

| | | | |
|---|---|---|---|
| CN | 105280140 | A | 1/2016 |
| CN | 105321455 | A | 2/2016 |
| CN | 105321456 | A | 2/2016 |
| CN | 106023899 | A | 10/2016 |
| CN | 107945722 | A | 4/2018 |
| CN | 107978259 | A | 5/2018 |
| CN | 110969990 | A | 4/2020 |
| CN | 111276100 | A | 6/2020 |
| CN | 111354313 | A | 6/2020 |
| CN | 111951734 | A | 11/2020 |
| CN | 112331113 | A | 2/2021 |
| WO | 2021066444 | A1 | 4/2021 |

* cited by examiner

CONTROL METHOD AND CONTROL DEVICE FOR CURRENT DETECTION APPARATUS

CROSS-REFERENCE TO RELATED APPLICATION

This application s the U.S. national phase of PCT Application No. PCT/CN2021/102523 filed on Jun. 25, 2021, which is incorporated herein by reference in its entirety.

TECHNICAL FIELD

The present disclosure relates to the technical field of organic electro-mechanical laser display, and more particularly, to a control method and a control device for a current detection apparatus.

BACKGROUND

Drive transistors (DTFT) in an organic light-emitting diode (OLED) will cause deviation of DTFT (such as $T_1$ in FIG. 1A) according to different currents, so the brightness of screen will be different, and the brightness of displayed picture will be uneven.

One of the external compensation techniques is to calculate the compensation amount of each pixel at different grayscales according to the detection parameters by detecting the electrical characteristics of each pixel drive transistor, such as the threshold voltage and the driving current, and store these compensation amounts in an external register, and when driving, superimpose these compensation amounts into the drive voltage of the pixel, so as to achieve brightness consistency between pixels.

With the development of technology, the luminous efficiency of OLED device is improved, and only a small pixel circuit is needed to meet the brightness requirements. For example, when there is a 255 grayscale display screen, the pixel current is only a few tens of nA, and the low grayscale current is only a few tens to hundreds of pA. It is particularly important to ensure the accuracy of current detection under small current. At the same time, in the sensing circuit, when the sensor changes in small current, the detection accuracy of small current is also required to be higher, so this scheme is to improve the detection accuracy of small current through the detection method.

SUMMARY

Embodiments of the present disclosure provide a control method and a control device for a current detection apparatus. The apparatus comprises: a plurality of detection circuits, wherein the detection circuits are coupled to a detection line in a display panel; and the detection line is coupled to a sensing control switch in a pixel circuit. The method comprises:

controlling the sensing control switch to be in an on state at a first time point before the current detection circuit performs an integration operation on the detection line; a duration between the first time point and an integration start time point at which the current detection circuit starts the integration operation being a first duration;

controlling the current detection circuit to start the integration operation on a current of the detection line at the integration start time point to obtain an integrated voltage signal corresponding to the detection line;

performing multiple samplings on the integrated voltage signal, and determining an output voltage difference between different sampling points; and determining the current of the detection line based on the output voltage difference.

In some embodiments, a duration between a time point when the integrated voltage signal is sampled for the first time and the integration start time point is a second duration, and the second duration is greater than or equal to a duration for establishing balance, wherein the duration for establishing balance is a duration required for the sensing control switch and the current detection circuit to establish stable balance with the detection line.

In some embodiments, the current detection circuit comprises an integration sub-circuit, the integration sub-circuit is configured to perform the integration operation, and before the controlling the current detection circuit to start the integration operation on a current of the detection line at the integration start time point, the method further comprises:

performing a reset operation on the detection line and the integration sub-circuit.

In some embodiments, before the performing a reset operation on the detection line and the integration sub-circuit, the method further comprises:

writing a grayscale voltage to a gate electrode of a drive transistor of the pixel circuit; and writing a reference voltage to a source electrode of the drive transistor and the detection line.

In some embodiments, an integrator is provided in the integration sub-circuit, a second end of the integrator is coupled to the detection line, a first end of the integrator is coupled to an initial voltage end, and the first end of the integrator is coupled to the detection line via a reset circuit, the reset circuit comprises a reset control switch and a follower amplifier, one end of the follower amplifier is coupled to the first end of the integrator, and another end is coupled to the reset control switch; and the performing a reset operation on the detection line, comprises:

turning on the reset control switch to reset a potential of the detection line and a potential of the source electrode of the drive transistor in the pixel circuit to an initial voltage.

In some embodiments, the integration sub-circuit is provided with an integrator, and the integrator comprises a low noise operational amplifier, an integrating capacitor and an integrating control switch which are arranged in parallel, wherein one end of the integrating capacitor and the integrating control switch is coupled to a second end of the low noise operational amplifier, and another end is coupled to a third end of the low noise operational amplifier, and a first end of the low noise operational amplifier is coupled to an initial voltage end; and the performing a reset operation on the integration sub-circuit, comprises:

turning on the integrating control switch to clear charges in the integrating capacitor.

In some embodiments, if the current detection circuit is coupled to a plurality of detection lines, grayscale voltages are written to pixel circuits respectively corresponding to the plurality of detection lines at a same time; and after completing the writing of the grayscale voltage, simultaneously performing the reset operation on the plurality of detection lines.

In some embodiments, each detection line is coupled to a multiplexing control switch; one end of each multiplexing control switch is coupled to the current detection circuit, and another end is coupled to a detection line; and after the determining the current of the detection line based on the output voltage difference, the method further comprises:

setting the multiplexing control switch to which the detection line is coupled to an off state, and turning on the multiplexing control switch of a next detection line to detect a current of the next detection line through the current detection circuit.

In some embodiments, the integration sub-circuit comprises a voltage acquisition circuit and a voltage difference determination circuit, and the performing multiple samplings on the integrated voltage signal, and determining an output voltage difference between different sampling points, comprises:

controlling the voltage acquisition circuit to acquire a first integrated voltage of the integrated voltage signal at a first integrated time point;

controlling the voltage acquisition circuit to acquire a second integrated voltage of the integrated voltage signal at a second integrated time point; and controlling the voltage difference determination circuit to determine a difference between the first integrated voltage and the second integrated voltage as the output voltage difference.

In some embodiments, the performing multiple samplings on the integrated voltage signal, and determining an output voltage difference between different sampling points, comprises:

forming a sampling point pair from two adjacent sampling points, and determining a voltage difference between the two sampling points in each sampling point pair; and determining an average of the voltage differences of different sampling point pairs as the output voltage difference.

In some embodiments, after the determining the current of the detection line based on the output voltage difference, the method further comprises:

if the current of the detection line is less than a preset value, then acquiring a compensation current of the detection line; and performing a correction operation on the current of the detection line based on the compensation current.

In some embodiments, the acquiring a compensation current of the detection line, comprises:

writing a drive voltage to the drive transistor in the pixel circuit; wherein a voltage difference between the gate electrode and the source electrode of the drive transistor of the drive voltage needs to be less than a threshold voltage of the drive transistor; and detecting a current of the detection line by the current detection circuit as the compensation current.

In some embodiments, the first duration is a duration of a capacitance balance phase required for a parasitic load capacitor to establish a stable balance with the pixel circuit and the sensing control switch;

the parasitic load capacitor is a capacitor created between the detection line and crossing lines of the different layers.

In some embodiments, the current detection circuit is connected to a plurality of detection lines via a plurality of multiplexing control switches, wherein the plurality of detection lines correspond to the plurality of multiplexing control switches on a one-to-one basis; and the method further comprises:

turning on any one of the multiplexing control switches, and controlling the current detection circuit to perform current detection on a detection line corresponding to the multiplexing control switch in an on state.

In some embodiments, the integration sub-circuit comprises a voltage difference determination circuit and a digital-to-analogue conversion circuit, and the current detection apparatus further comprises a controller;

the voltage difference determination circuit is configured to determine an output voltage difference between different sampling points, and sending the output voltage difference to the digital-to-analogue conversion circuit;

the digital-to-analogue conversion circuit is configured to perform digital-to-analogue conversion on the output voltage difference and sending a conversion result to the controller;

the controller is configured to determine a current of the detection line according to the conversion result.

In some embodiments, the integration sub-circuit further comprises a multi-path channel selection switch and a plurality of voltage acquisition circuits, wherein the plurality of voltage acquisition circuits comprise at least two voltage acquisition circuits; and the performing multiple samplings on the integrated voltage signal, and determining an output voltage difference between different sampling points, comprises:

performing multiple samplings on the integrated voltage signal of the detection line by one voltage acquisition circuit to obtain a plurality of sampling points, and saving the plurality of sampling points; when the remaining voltage acquisition circuits perform current detection on other detection lines, performing multiple samplings on the integrated voltage signals of other detection lines to obtain a plurality of sampling points, and saving the plurality of sampling points;

at a specified timing for performing current detection on a next detection line of the detection lines, and controlling the multi-path channel selection switch to turn on a voltage acquisition circuit saving the sampling points of the detection line; and acquiring a plurality of sampling points of the detection line through the multi-path channel selection switch, and determining the output voltage difference based on the plurality of sampling points.

In some embodiments, after saving the plurality of the sampling points of the integrated voltage signal of a detection line, setting the multiplexing control switch between the detection line and a current detection circuit to an off state, and setting a multiplexing control switch between a next detection line of the detection lines and the current detection circuit to an on state.

In some embodiments, the specified timing is before an integrated voltage signal of a next detection lines is sampled by the integration sub-circuit, and after a multiplexing control switch corresponding to the next detection line is in an on state.

In a second aspect, embodiments of the present disclosure further provide a control device for a current detection apparatus, wherein the current detection apparatus comprises: a current detection circuit; a detection line is coupled to the current detection circuit, and the current detection circuit is configured to detect a current of the detection line. The apparatus comprises a processor and a memory;

the memory is configured to store a computer program executable by the processor;

the processor is coupled to the memory and configured to perform the method according any one of above.

BRIEF DESCRIPTION OF THE DRAWINGS

In order to explain the technical solution of the embodiments of the present disclosure more clearly, the following figures will be briefly described as the embodiments of the present disclosure need to be used; it is obvious that the figures described below are only some embodiments of the present disclosure, and a person skilled in the art would have been able to obtain other figures according to these figures without involving any inventive effort.

DETAILED DESCRIPTION

Figure 1A:
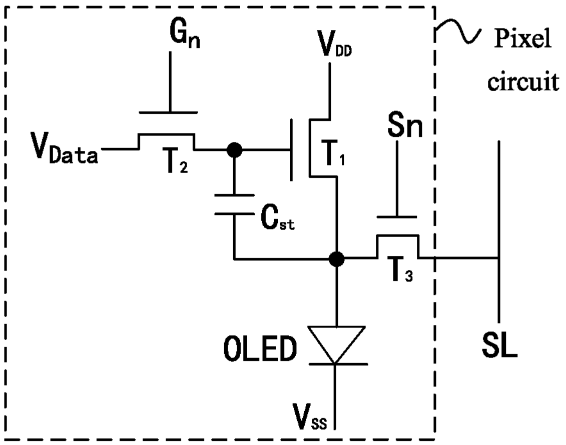
FIG. 1A is a schematic diagram of a pixel circuit arrangement of a current detection apparatus provided in an embodiment of the present disclosure.

In order that those of ordinary skill in the art may better understand the technical aspects of the present disclosure, the following detailed description of the embodiments of the present disclosure is provided with reference to the accompanying drawings.

It is noted that the terms "first", "second", and the like in the description and in the claims of the present disclosure are used for distinguishing between similar items and not necessarily for describing a particular sequential or chronological order. It is to be understood that the data so used are interchangeable under appropriate circumstances such that the embodiments of the disclosure described herein are capable of operation in sequences other than those illustrated or otherwise described herein. The embodiments described in the following illustrative examples do not represent all embodiments consistent with the present disclosure. Rather, they are merely examples of apparatus and methods consistent with certain aspects of the present disclosure, as detailed in the appended claims.

The terms "comprising" or "comprises", and the like, means that the presence of an element or item preceding the word covers the presence of the element or item listed after the word and equivalents thereof, but does not exclude other elements or items. The terms "connecting" or "connected" and the like are not limited to physical or mechanical connections, but may include electrical connections, whether direct or indirect.

It should be noted that the sizes and shapes of the various figures in the drawings do not reflect true proportions, and are intended only to illustrate the present disclosure. And the same or similar reference numerals denote the same or similar elements or elements having the same or similar functions throughout.

Figure 2:
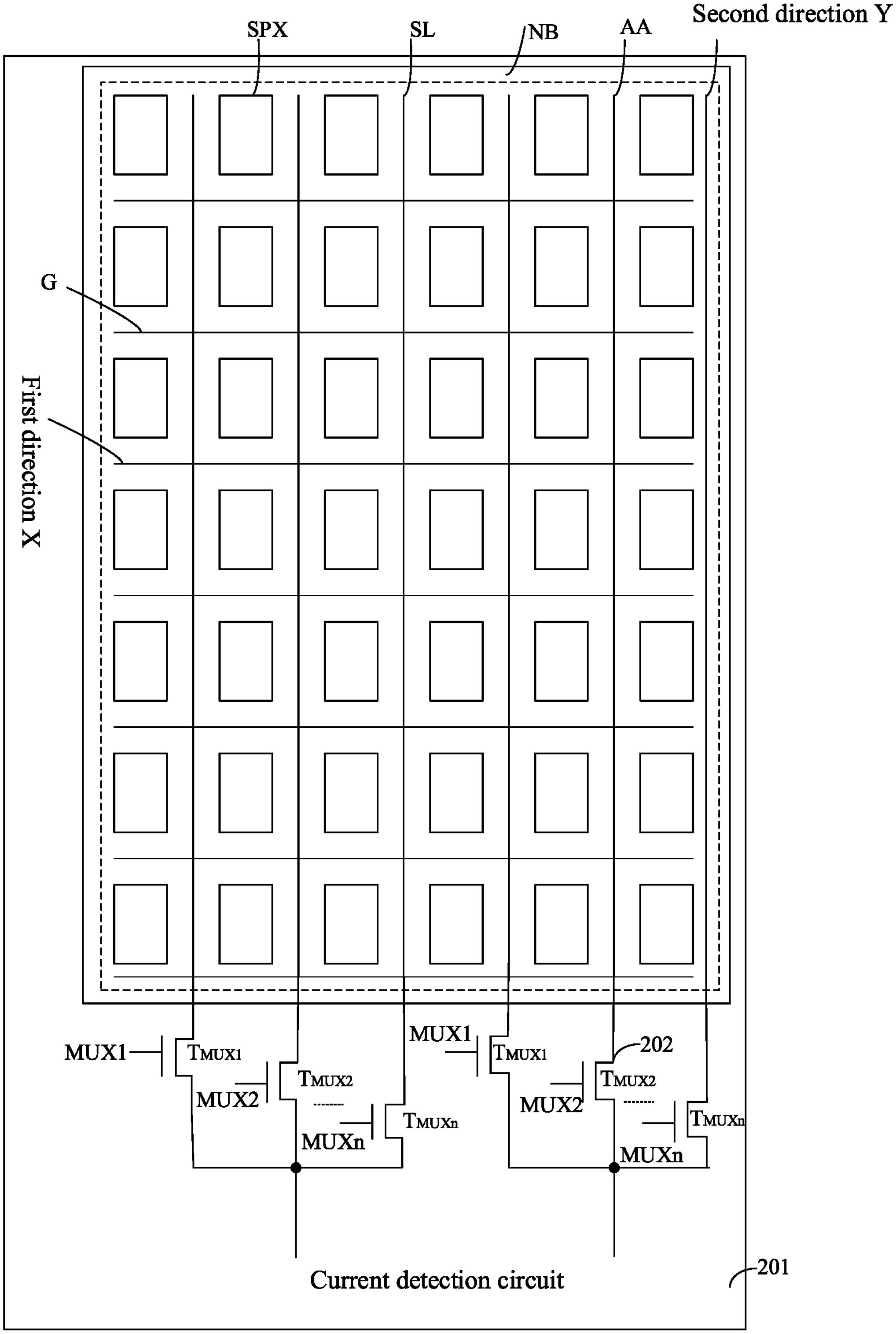
FIG. 2 is a schematic diagram of a display panel of a current detection apparatus provided in the embodiment of the present disclosure.

By way of example, the transistors of the pixel circuit may be either N-type or P-type, and the present disclosure is not limited thereto. In the embodiment of the present disclosure, the transistor is N-type, and the drive transistor $T_1$, the first switch transistor $T_2$, the sensing control switch ($T_3$) and the storage capacitor $C_{st}$ constitute a 3T1C pixel circuit as shown in FIG. 1A, and are connected to the detection line (detection line, SL) via the sensing control switch ($T_3$). The pixel circuit controls the drive transistor $T_1$ to generate an operating current to drive the electroluminescent diode OLED to emit light by controlling the first switching transistor $T_2$ to turn on so as to write the grayscale voltage $V_{data}$ of the pixel circuit to the gate electrode of the drive transistor $T_1$. The drive current IDS of the drive transistor $T_1$ is given by the following formula (1):

$$I_{DS} = k(V_{GS} - V_{th})^2 = k(V_{data} - V_{OLED} - V_{th})^2; \quad \text{formula (1)}$$

$$\text{where } k = k = \frac{1}{2}\mu C_{ox}\frac{W}{L};$$

where μ represents the mobility, cox represents the drive transistor gate oxide capacitance, W represents the width of the channel of the drive transistor $T_1$, and L represents the length of the channel of the drive transistor $T_1$. $V_{GS}$ represents the voltage difference between the gate electrode voltage and the source electrode voltage of the drive transistor $T_1$, $V_{th}$ represents the threshold voltage of the drive transistor $T_1$, $V_{data}$ represents the data voltage at the data signal terminal, and $V_{OLED}$ represents the voltage at the anode voltage supply terminal of the OLED device. However, the threshold voltage $V_{th}$ and mobility μ between different pixels, resulting in different brightness of the pixels at the same grayscale. At the same time, as the service time increases, ageing and the like may occur to the drive transistor $T_1$, which results in the drift of the threshold voltage and mobility of the drive transistor $T_1$, and also aggravates the difference in display brightness. For example, it is also necessary to provide a detection line SL in the display area AA of the display panel 200 as shown in FIG. 2 and a sensing control switch $T_3$ coupled to the drain electrode of the drive transistor $T_1$ in the pixel circuit. Also, as shown in FIG. 2, one detection circuit couples a plurality of detection lines SL.

OLED and quantum dot light-emitting diodes (QLED) and other electroluminescent diodes have the advantages of self-luminescence, low energy consumption and so on, which is one of the hot spots in the field of electroluminescent display panel application. Electroluminescent diodes are generally current driven and require a steady current to drive them to emit light. After the electroluminescent diode is applied to the display panel 200, a pixel circuit is generally used to drive the electroluminescent diode to emit light.

In a particular implementation, in an embodiment of the present disclosure, as shown in FIG. 2, a display panel 200 may include: display area AA (Active area) and non-display area NB of the border section around AA. The display area AA comprises a plurality of pixels arranged in an array. Each pixel comprises a plurality of sub-pixels spx. Illustratively, a pixel may include a red sub-pixel, a green sub-pixel, and a blue sub-pixel, such that color mixing may be performed by red, green, and blue to achieve a color display. Alternatively, the pixels may include a red sub-pixel, a green sub-pixel, a blue sub-pixel, and a white sub-pixel, such that color mixing may be performed by red, green, and blue to achieve color display. Of course, in practical applications, the light emission color of the sub-pixel spx in the pixel can be designed and determined according to the practical application environment, and is not limited herein.

In a particular implementation, the sub-pixel spx may include an electroluminescent diode and a pixel circuit for driving the electroluminescent diode to emit light. Wherein the electroluminescent diode comprises an anode, a light-emitting functional layer and a cathode layer which are arranged in a stack. The light-emitting functional layer may include: a hole injection layer located between the anode and cathode layers, a hole transport layer located between the hole injection layer and the cathode layer, an organic light-emitting layer located between the hole transport layer and the cathode layer, a hole blocking layer located between the organic light-emitting layer and the cathode layer, and an electron transport layer located between the hole blocking layer and the cathode layer.

However, as shown in conjunction with FIGS. 1A and 2, the display area AA of the display panel 200 further has a plurality of scanning lines G, and the first switching transistor $T_2$ in one row of the sub-pixels spx is coupled to one scanning line such that the scanning lines and the data lines $V_{data}$ (not shown in both FIGS. 1A and 2) and the detection line SL are crossed such that a load capacitance and a line resistance are provided between the detection line SL and the scanning lines G. Due to the effect of load capacitance and line resistance, when the signal on the scanning line G fluctuates, the current signal transmitted on the detection line SL will change, thus causing the current on the detected detection line SL to be inaccurate, thus resulting in inaccurate external compensation and affecting the display effect of the picture.

Figure 1B:
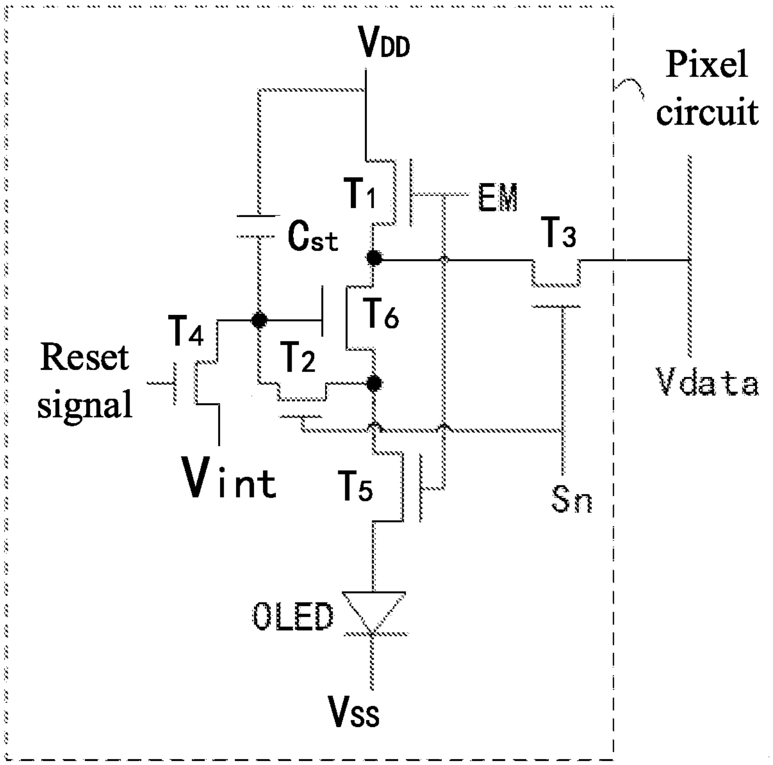
FIG. 1B is a schematic diagram of a 6T1C internally compensated pixel circuit arrangement of a current detection apparatus provided in an embodiment of the present disclosure.

In the related art, most of the methods using pixel internal self-compensation, as shown in FIG. 1B, for example, using 6T1C internal compensation pixel circuit, 6 thin film transistors (TFT) and 1 capacitor as well as 6 EA (Elementa advance) signal lines are required, and the resolution of the corresponding display device becomes higher and higher as the picture quality of the display device increases. As the resolution is higher, the space occupied by each pixel becomes smaller and smaller. The increasing number of electronic and control signal lines (including the detection line SL and the scan line G) and the limited pixel space form an irreconcilable contradiction.

In addition to the compensation by means of pixel internal self-compensation, there is an external compensation method. The external compensation method is to save the detected electrical parameter of each pixel circuit to an external memory by an external circuit regarding the electrical characteristics, such as threshold voltage, mobility, etc. of the drive transistor $T_1$ of each pixel circuit; and when a display screen displays and drives, converting the electrical parameter of this drive transistor $T_1$ into a grayscale voltage and adding same to display data, so that the difference in the electrical parameter of this drive transistor is compensated.

The inventors have found that one of the most important techniques for the external compensation method is the detection of an electrical parameter of the drive transistor $T_1$ in the pixel circuit. Generally, there are now two detection methods, one voltage detection and one current detection. The principle of voltage detection is to drive and charge the detection line SL through the drive transistor $T_1$ in the pixel circuit, read the voltage on the detection line SL when the voltage on the detection line SL is full, and from this voltage, the threshold voltage of the drive transistor $T_1$ can be derived.

In general, the drive transistor $T_1$ of the pixel circuit increases the area of the drive transistor $T_1$ as much as possible in a limited pixel space to improve the drive capability of the drive transistor $T_1$, and the storage capacitance (Cs) in the method of self-compensation inside the pixel is relatively small, and the drive transistor can fill the storage capacitance quickly. However, in the external compensation method, the detection line SL is relatively long and intersects with the scanning line G of the pixel and other signal lines, so that the presence of the load capacitance and the line resistance leads to inaccurate detection parameters of the drive transistor $T_1$. In addition, since the driving current of the drive transistor $T_1$ decreases as the voltage of the detection line SL increases, the voltage detection method generally requires a long time, and therefore the voltage detection generally detects the electrical parameter of the display screen before leaving the factory or before starting up.

In view of the above, the present disclosure provides a current detection apparatus and method, and the inventive concept of the present disclosure can be summarized as follows: a drive voltage is written into a storage capacitor $C_{st}$ of a pixel circuit; a drive transistor $T_1$ outputs a constant current to a detection line SL; an integration operation is performed on the current of the detection line SL using an integration sub-circuit to obtain an output voltage; and the current of the detection line SL is obtained according to the output voltage. It will be appreciated by those skilled in the art that the pixel circuit corresponding to the current detection apparatus of the present disclosure includes, but is not limited to, a 6T1C internal compensation pixel circuit as shown in FIG. 1B, and other pixel circuits having a detection line such as 3T1C, 4T1C, 5T1C and 5T2C are also applicable to the present disclosure, and the present disclosure is not limited thereto. Further, regardless of the pixel circuit, the transistor connected to the detection line in the pixel circuit may be referred to as a sensing control switch $T_3$.

Figure 3:
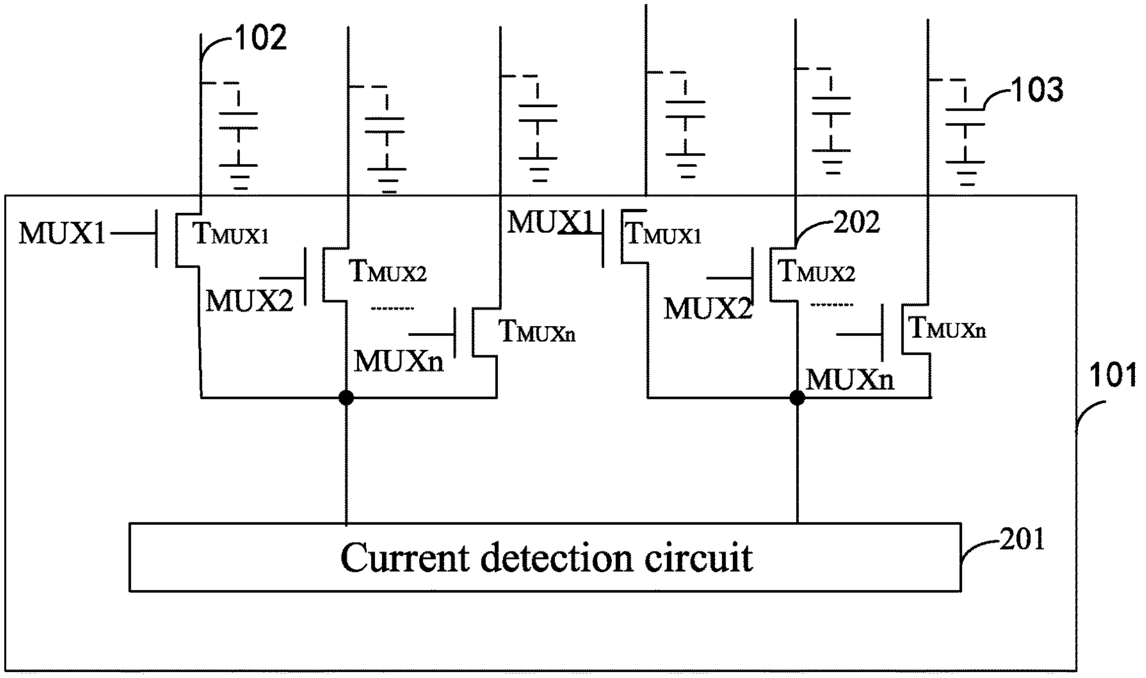
FIG. 3 is a schematic diagram of a current detection apparatus provided in an embodiment of the present disclosure.

The current detection apparatus provided in the embodiment of the present disclosure includes a plurality of detection circuits, and one detection circuit of the current detection apparatus is illustrated in FIG. 3. Included in FIG. 3 are: a detection circuit 101, a detection line 102 (equivalent to the detection line SL described above, which will not be described later); wherein one detection circuit 101 corresponds to at least one detection line 102 in the display panel; the detection circuit 101 comprises a current detection circuit 201; the detection line 102 is a metal line extending along the second direction, and is arranged on different layers via a metal material between the detection line 102 and the scanning line G extending along the first direction as shown in FIG. 2; therefore, such a line extending along different directions would have cross points, and the cross area between the detection line 102 and the scanning line G and the metal material would constitute a parasitic capacitance, namely, a parasitic load capacitor 103 as shown in FIG. 3.

In some embodiments, the first direction may be a transverse direction and the second direction may be a longitudinal direction, the first direction X intersecting the second direction Y. The present disclosure is not limited as to the direction of extension of the first direction X and the second direction Y, and the angle between these two directions. For example, the angle between the first direction X and the second direction Y is between 70° and 90° inclusive. For example, the angle between the first direction X and the second direction Y is 70°, 75°, 85°, 90°, or 80°, etc., and the specific value of the angle can be set according to actual situations, and the embodiments of the present disclosure are not limited thereto.

In the embodiment of the present application, in order to facilitate selecting which detection line 102 to detect the current, multiplexing control switches 202 (namely, $MUX_{1-n}$ in FIG. 2) are further provided in the detection circuit 101, wherein each multiplexing control switch 202 corresponds to one detection line 102.

The multiplexing control switch 202 has one end coupled to the current detection circuit 201 and another end coupled to the corresponding detection line 102. That is, each of the multiplexing control switches 202 corresponds to at least one of the detection lines 102, and the detection of the corresponding detection line 102 is realized by controlling the conduction of the multiplexing control switch 202.

In some embodiments, the multiplexing control switch 202 may be: a four-to-one multiplexer, a six-to-one multiplexer, an eight-to-one multiplexer (MUX), etc., and other switches having a control function are all applicable to the current detection apparatus provided in the embodiment of the present disclosure.

The current detection circuit 201 is configured to detect the current on the detection line 102 to which the multiplexing control switch 202 currently in the on state is connected.

Figure 4A:
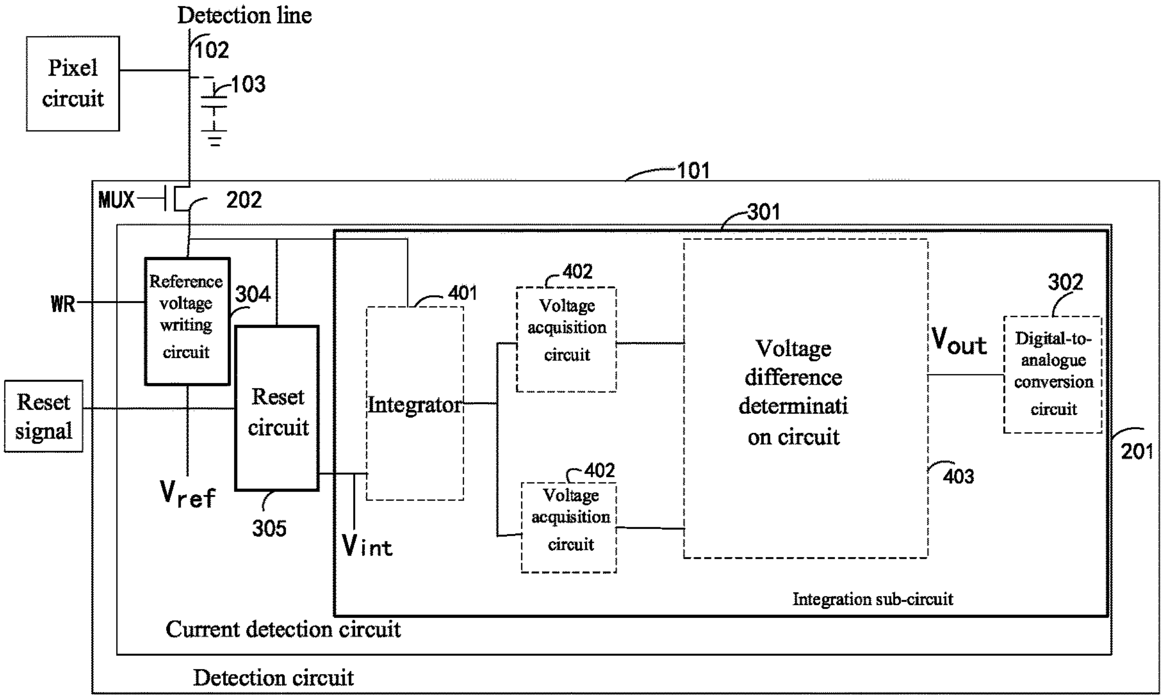
FIG. 4A is a schematic diagram of an overall framework of a current detection apparatus provided in an embodiment of the present disclosure.
Figure 4B:
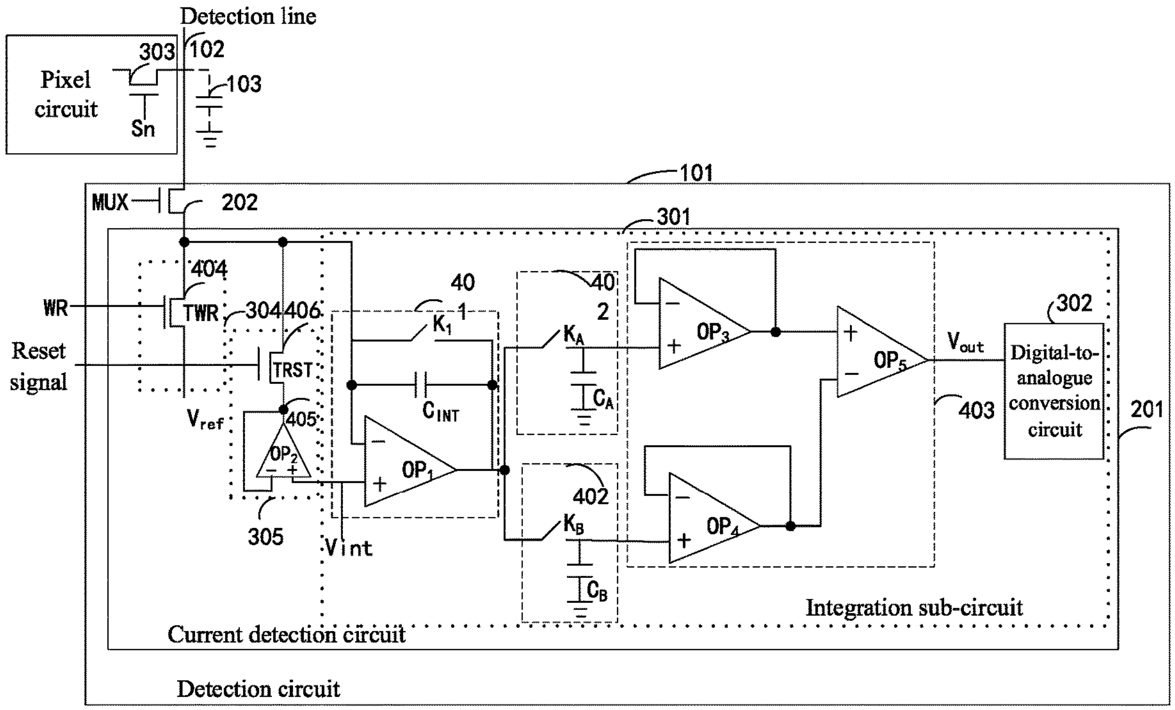
FIG. 4B is an overall schematic diagram of a current detection apparatus provided in an embodiment of the present disclosure.

In practice, the current detection apparatus may comprise a plurality of current detection circuits 201, each corresponding to a plurality of detection lines 102. In order to facilitate understanding, the specific structure and function of the current detection circuit 201 will be described in detail with reference to the accompanying drawings. Taking one pixel circuit of one detection line 102 and a corresponding current detection circuit 201 as an example, as shown in FIGS. 4A and 4B:

the current detection circuit 201 comprises an integration sub-circuit 301, a reference voltage writing circuit 304 and a reset circuit 305;

the integration sub-circuit 301 configured to perform an integration operation on the current on the detection line 102 to obtain an integrated voltage signal;

since the current on the detection line 102 flows to the integration sub-circuit 301 during the initial phase of integration, a balanced charging of the parasitic load capacitor 103 on the detection line 102 is required. When the steady state is reached, the current on the detection line 102 can all flow to the integration sub-circuit 301 to generate a voltage drop, so that in the case of a small current, the error of the detected current on the detection line 102 is relatively large during the balance establishing phase at the beginning of integration (namely, during the time period of charging the parasitic load capacitor 103).

In some embodiments, in order to eliminate the error caused during the balance establishing phase at the beginning of integration, as shown in FIGS. 4A and 4B, in the embodiment of the present application, the integration sub-circuit 301 comprises an integrator 401, a plurality of voltage acquisition circuits 402 and a voltage difference determination circuit 403, and a digital-to-analogue conversion circuit 302, wherein:

one end of the integrator 401 is coupled to the voltage acquisition circuit 402, and another ends thereof are respectively coupled to the initial voltage end $V_{INT}$ and the multiplexing control switch 202, wherein a second end of the integrator 401 is coupled to the multiplexing control switch 202, and a first end thereof is coupled to the initial voltage end $V_{INT}$. The initial voltage end $V_{INT}$ is configured to provide an initial voltage $V_{int}$, and the integrator 401 is configured to perform an integration operation on the current on the detection line 102 to obtain an integrated voltage signal over time. As shown in FIG. 4B, the integrator 401 includes an integrating control switch $K_1$, an integrating capacitor $C_{INT}$, and a low noise operational amplifier $OP_1$ arranged in parallel. The low noise operational amplifier $OP_1$ is provided with a first end and a second end and a third end. One end of the integrating capacitor $C_{INT}$ and the integrating control switch $K_1$ is coupled to the second end of the low noise operational amplifier $OP_1$, another end is coupled to the third end of the low noise operational amplifier $OP_1$, and the first end of the low noise operational amplifier $OP_1$ is coupled to the initial voltage end $V_{INT}$. The first end may be a positive input end, the second end may be a negative input end, and the third end may be an output end. Alternatively, the first end may be a negative input end, the second end may be a positive input end, and the third end may be an output end. The present application does not define this.

The integrator has a reset function when the integrating control switch $K_1$ is turned on, mainly clearing the charge on the integrating capacitor $C_{INT}$. When the integrating control switch $K_1$ is turned off, the integrator 401 starts to operate (i.e., an integration operation starts).

As shown in FIGS. 4A and 4B, two voltage acquisition circuits 402 are shown. As shown in FIG. 4B, one of the voltage acquisition circuits 402 includes an acquisition switch $K_A$, a holding capacitor $C_A$, and the other voltage acquisition circuit 402 includes an acquisition switch $K_B$, a holding capacitor $C_B$. The voltage acquisition circuit 402 is configured to acquire the voltage of the integrator 401 at a specified integrated time point so as to realize the sampling of the integrated voltage signal, and save the sampled voltage to the holding capacitors $C_A$ and $C_B$; wherein different voltage acquisition circuits 402 correspond to different specified integrated time points, namely, holding capacitors $C_A$ and $C_B$ store voltages at different integrated time points. To collect voltages at different integrated time points, the present disclosure provides multiple voltage acquisition circuits 402 in the integration sub-circuit 301. To facilitate understanding, two voltage acquisition circuits 402 are illustrated in FIGS. 4A and 4B, wherein:

as shown in FIG. 4B, one end of the acquisition switch $K_A$ is coupled to a first end of the follower $OP_3$ with a high input impedance and the holding capacitor $C_A$ in the voltage difference determination circuit 403, and another end is coupled to a third end of the integrator 401; the acquisition switch $K_B$ has one end coupled to a first end of a high input impedance follower $OP_4$ and a holding capacitor $C_B$ in the voltage difference determination circuit 403 and another end coupled to a third end of the integrator 401.

The holding capacitors $C_A$, $C_B$ of the voltage acquisition circuit 402 $C_B$ have a first end coupled to a corresponding acquisition switch $K_A$, $K_B$, respectively, and a second end coupled to a grounding end. As shown in FIG. 4B, the high input impedance followers $OP_3$ and $OP_4$ sample the integrated voltage signal via the acquisition switches $K_A$ and $K_B$, respectively, keeping the voltages $V_A$ and $V_B$ at different specified integrated time points in the holding capacitors $C_A$ and $C_B$, respectively.

The voltage difference determination circuit 403 is configured to calculate the output voltage difference of different sampling points obtained by the plurality of voltage acquisition circuits 402, and send the output voltage difference to the digital-to-analogue conversion circuit 302 for digital-to-analogue conversion. As shown in FIG. 4B, the voltage difference determination circuit 403 is provided with: a plurality of subtracters $OP_5$ (only one shown in FIG. 4B) and high input impedance followers; wherein:

for any one of the subtracters, the two input ends of the subtracter are coupled to two high input impedance followers, respectively, and the third end of the subtracter is coupled to the digital-to-analogue conversion circuit 302.

Each of the high input impedance followers has one end coupled to the subtracter and another end coupled to a voltage acquisition circuit. As shown in FIG. 4B, the two input ends of subtracter $OP_5$ are coupled to high input impedance followers $OP_3$ and $OP_4$, respectively.

Figure 11:
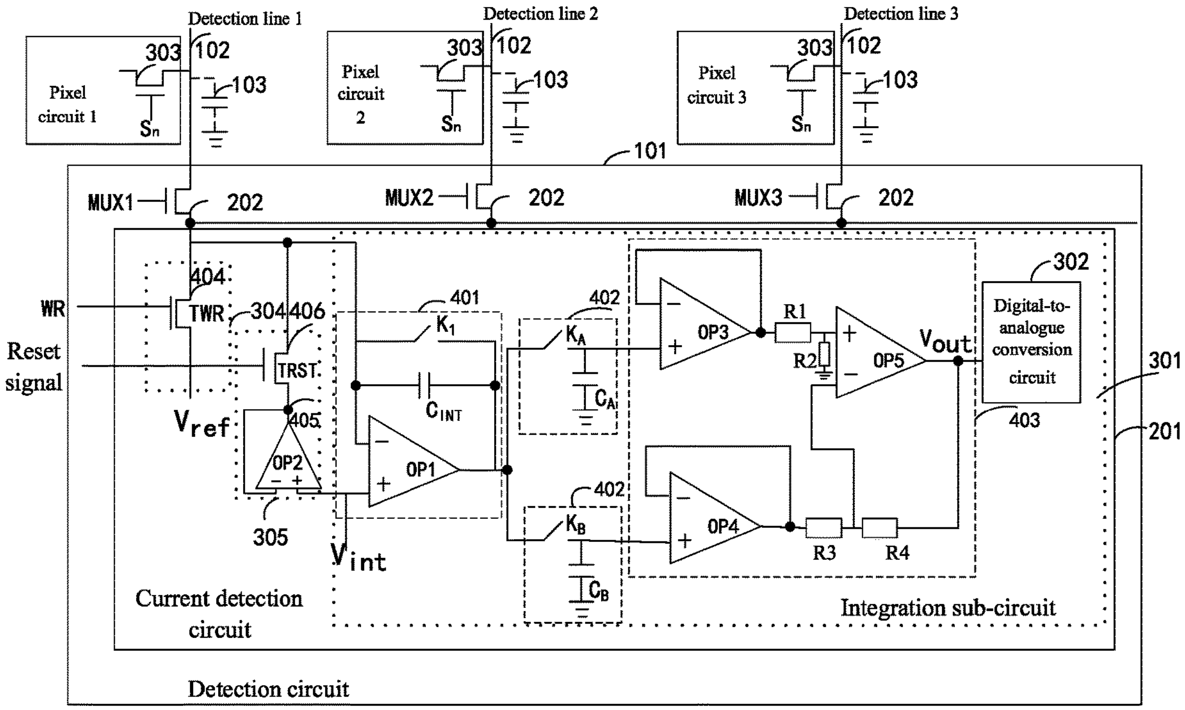
FIG. 11 is a schematic diagram of a current detection apparatus provided in an embodiment of the present disclosure.

In the embodiment of the present application, in order to flexibly set the amplification factor of the subtracter $OP_5$, a first resistance module and a second resistance module are further provided in the voltage difference determination circuit 403, as shown in FIG. 11, wherein: one end of the first resistance module is coupled to a first end of the subtracter, and another end is coupled to a third end of a high input impedance follower; the second resistance module is coupled at one end to a second end of the subtracter and at another end to a third end of another high input impedance follower.

In some embodiments, two resistors can be provided in the above-mentioned first resistance module and second resistance module; as shown in FIG. 11, the first resistance module comprises a first resistor and a second resistor, wherein one end of the first resistor is coupled to the third end of the high input impedance follower, another end is coupled to the second resistor and the first end of the subtracter, and another end of the second resistor is coupled to the grounding end; the second resistance module comprises a third resistor and a fourth resistor, wherein one end of the third resistor is coupled to the third end of the high input impedance follower, another end is coupled to the fourth resistor and the second end of the subtracter, and another end of the fourth resistor is coupled to the third end of the subtracter. It should be understood, however, that the present disclosure is not limited as to the number of resistors in the first and second resistance modules.

It is assumed that the integrated voltage VA of the detection line obtained at the first integrated time point t is a first integrated voltage, the integrated voltage VB of the detection line obtained at the second integrated time point (t+T) is a second integrated voltage, the first integrated voltage $V_A$ and the second integrated voltage VB are respectively stored in the holding capacitors $C_A$ and $C_B$, the first ends of the holding capacitors $C_A$ and $C_B$ are respectively coupled to the high input impedance followers $OP_3$ and $OP_4$, and then the voltage difference is obtained via the subtracter $OP_5$ as shown in formula 2:

$$V_{out} = V_A - V_B; \quad \text{formula (2)}$$

$V_{out}$ represents the output voltage difference at time point t and at time point t+T, which means that the change in the integrated voltage during the integration time period T is $V_{out}=V_A-V_B$.

After obtaining the output voltage difference, the output voltage difference $V_{out}$ is converted into a digital signal from an electrical signal, so the present disclosure provides a digital-to-analogue conversion circuit 302 in the integration sub-circuit 301 so as to output to the controller, so that the controller determines the current of the detection line 102 according to the output voltages at different integrated time points.

Of course, it should be noted that the arrangement of the two voltage acquisition circuits 402 shown in FIGS. 4A and 4B is not limited. As in another embodiment, a plurality of voltage acquisition circuits 402 may also be provided in the present disclosure. Each voltage acquisition circuit sequentially samples the integrated voltage signal in a time sequence to obtain a plurality of sampling points. A sampling point pair is formed by two adjacent sampling points, and a voltage difference between two sampling points in each sampling point pair is determined, thereby obtaining a plurality of voltage differences, and then an input voltage difference can be obtained by averaging the plurality of voltage differences. For example, taking four voltage acquisition circuits 402 as an example, the first voltage acquisition circuit 402 saves the voltage at the time point t to the holding capacitor $C_A$, the second voltage acquisition circuit 402 saves the voltage at the time point (t+T) to the holding capacitor $C_B$ after starting integration, the third voltage acquisition circuit 402 saves the voltage at the time point (t+2T) to the holding capacitor $C_C$, and the fourth voltage acquisition circuit 402 saves the voltage at the time point (t+3T) to the holding capacitor $C_D$, so that the voltage difference between the time point t and the time point (t+T) can be calculated. The voltage difference between the (t+2T) time point and the (t+3T) time point is averaged to obtain the voltage difference. Such analogy can be extended to more voltage acquisition circuits 402; however, it should be noted that in the above-mentioned example, T represents the time interval between sampling points, and the time interval T between sampling points arranged in sequence in a time sequence may be the same or different, namely, the integrated voltage signal may be sampled at equal intervals, or may be sampled at non-equal intervals, both being applicable to the embodiment of the present application.

In the present disclosure, the detection line 102 is coupled to a sensing control switch 303 in a corresponding pixel circuit as shown in FIG. 4B. The sensing control switch 303 is coupled at one end to the corresponding detection line 102 and at another end to the pixel circuit as shown in FIG. 1A (only the sensing control switch 303 is shown in FIG. 4B), and the function thereof has been described in FIG. 1A and will not be repeated here.

As shown in FIG. 4B, one end of the reference voltage write circuit 304 is coupled to the multiplexing control switch 202 and another end is coupled to a reference voltage end $V_{REF}$ configured to provide a reference voltage $V_{ref}$. The reference voltage write circuit 304 includes a reference level control switch 404 having a gate electrode coupled to a control level WR. As shown in FIG. 4B, the reference voltage writing circuit 304 is configured to write the reference voltage $V_{ref}$ to one end of the storage capacitor $C_{st}$ (e.g., $C_{st}$ shown in FIG. 1A) of the pixel circuit through the multiplexing control switch 202, the detection line 102, and the sensing control switch 303.

In some embodiments, the data writing phase is described with reference level control switch 404 being a TWR transistor. The TWR transistor and the other transistors (such as the drive transistor $T_1$, the first switch transistor $T_2$ and the sensing control switch $T_3$ in FIG. 1A) and the control switch (such as the multiplexing control switch 202) in the present disclosure have the same manufacturing process, which is simple and easy to realize; when writing data to the gate-source phase of the drive transistor $T_1$ in the pixel circuit, the reference voltage $V_{ref}$ is at a high level, the sensing control switch 303 and the reference level control switch 404 (the TWR tube) are conductive, and the reference voltage end $V_{REF}$ writes the reference voltage $V_{ref}$ to the source electrode of the drive transistor $T_1$ via the reference level control switch 404 (the TWR tube), the detection line 102 and the sensing control switch 303. When the $V_{ref}$ is controlled to be at a high level, and at the same time the first switching transistor $T_2$ is controlled to be turned on, the grayscale voltage $V_{data}$ on the pixel circuit is written to the gate electrode of the drive transistor $T_1$. Therefore, the gate-source electrode voltage of the drive transistor $T_1$ during the data writing phase is as shown in formula 3:

$$V_{GS} = V_{data} - V_{ref}; \qquad \text{formula (3)}$$

The drive transistor T1 outputs a constant current:

$$I_{T1} = \frac{1}{2}\mu C_{OX}\frac{W}{L}(V_{data} - V_{ref} - V_{TH})^2.$$

As shown in FIG. 4B, a reset circuit 305, one end of which is coupled to the multiplexing control switch 202 and another end of which is coupled to the initial voltage end $V_{INT}$ and the low noise operational amplifier $OP_1$, is configured to reset the voltage of the detection line 102. That is, the voltage on the detection line 102 is reset to reset the voltage on the detection line 102 to the initial voltage $V_{int}$. The reset circuit 305 is provided with: a follower amplifier 405 and a reset control switch 406; wherein:

a follower amplifier (as $OP_2$ in FIG. 4B) 405, one end of which is coupled to the reset control switch 406, and another end of which is coupled to the initial voltage end $V_{INT}$, is configured to reset the voltage on the detection line 102 to the initial voltage $V_{int}$ when the reset control switch 406 is in an on state.

In some embodiments, taking the reset control switch 406 as an example of a TRST transistor, the TRST transistor is the same as process as other transistors and control switches in the present disclosure and is simple to implement. A reset control switch 406 (TRST tube) is coupled at one end to a corresponding multiplexing control switch 202 on the plurality of detection lines 102 and at one end to a follower amplifier 405. The reset circuit 305 is configured to reset the voltage on the detection line 102 to the initial voltage $V_{int}$ before the integrator 401 begins the integration operation, thereby reducing the time of the balance establishing phase in integration of the detection line 102.

Figure 4C:
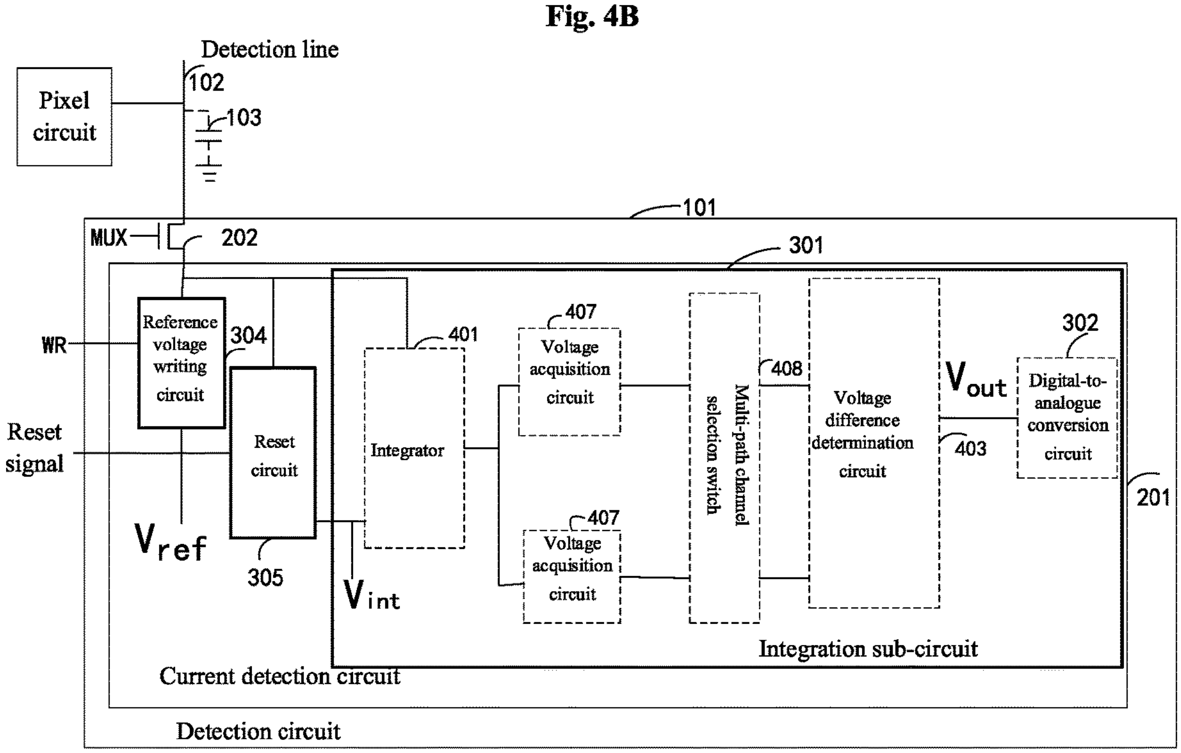
FIG. 4C is a schematic diagram of an overall framework of a current detection apparatus provided in an embodiment of the present disclosure.

In some embodiments, in order to improve detection efficiency, the above-described embodiment of the present application provides that the integration sub-circuit 301 as shown in FIG. 4B can be replaced with the integration sub-circuit 301 as shown in FIG. 4C. It should be understood that FIG. 4A is identical to the scheme provided in FIG. 4C in the operation during the data writing phase and reset phase, except for the structure and operating principle of the integration sub-circuit 301 as shown in FIG. 4B and the integration sub-circuit 301 as shown in FIG. 4C, wherein the operating efficiency of the integration sub-circuit 301 as shown in FIG. 4C can be understood to be higher than that of the integration sub-circuit 301 as shown in FIG. 4B. An integrator 401, a plurality of voltage acquisition circuits 407, a multi-path channel selection switch 408 and a digital-to-analogue conversion circuit 302 are provided in the integration sub-circuit as shown in FIG. 4C, wherein the plurality of voltage acquisition circuits 407 comprises at least two voltage acquisition circuits 407.

Figure 4D:
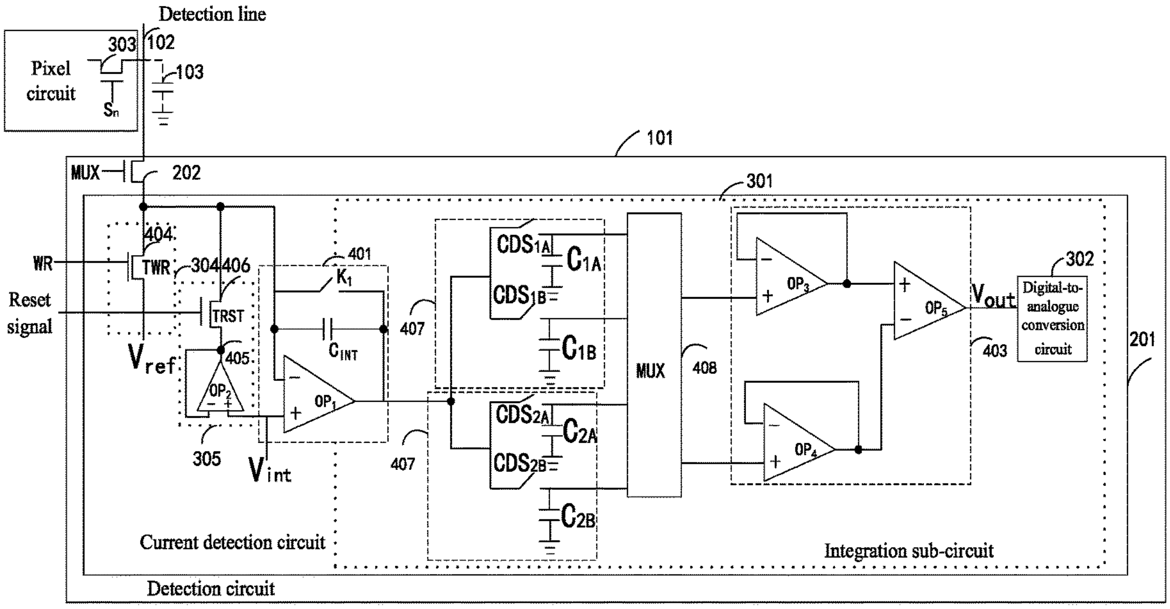
FIG. 4D is an overall schematic diagram of a current detection apparatus provided in an embodiment of the present disclosure.

As shown in FIGS. 4C and 4D, an integrator 401 is configured to perform an integration operation on the current on the detection line 102 to obtain an integrated voltage signal over time;

at least two voltage acquisition circuits 407 are configured to perform multiple samplings on the integrated voltage signal of the detection line 102 by one voltage acquisition circuit 407 to obtain a plurality of sampling points, and save the plurality of sampling points; when the remaining voltage acquisition circuits 407 perform current detection on other detection lines 102, multiple sampling is performed on the integrated voltage signals of other detection lines 102 to obtain a plurality of sampling points, and save the plurality of sampling points.

As in some embodiments, the plurality of sets of voltage acquisition circuits includes a first set of voltage acquisition circuits and a second set of voltage acquisition circuits, two sets of voltage acquisition circuits are illustrated in FIGS. 4C and 4D for ease of illustration. A first voltage acquisition circuit and a second voltage acquisition circuit are configured to perform multiple sampling on the integrated voltage signal of the detection line by one voltage acquisition circuit to obtain a plurality of sampling points, and the plurality of sampling points are saved; when current detection is performed on the next detection line of the detection lines by the other voltage acquisition circuit, multiple samplings are performed on the integrated voltage signal of the next detection line of the detection lines to obtain a plurality of sampling points, and the plurality of sampling points are saved. For example: since the operations in the data writing phase and the reset phase are the same, it will not be described in detail here. When the detection line 1 is detected by using the integration sub-circuit 301 as shown in FIG. 4C, after the data writing phase and the reset phase are finished, a capacitance balance phase is performed; in the capacitance balance phase, the sensing control switch 303, the multiplexing control switch 202 and the reset switch K1 are in an on state; and after the capacitance balance phase is finished, in the sampling phase, a first voltage acquisition circuit is used to perform multiple sampling on the integrated voltage signal of the detection line 1 to obtain multiple sampling points and save same. Then, the multiplexing control switch 202 of the detection line 1 is turned off, and the multiplexing control switch 202 of the detection line 2 is turned on, so that the current detection circuit 201 can perform current detection on the detection line 2. When detecting the detection line 2, firstly performing a capacitance balance phase, and after the capacitance balance phase is finished, using a second voltage acquisition circuit to obtain multiple sampling points after performing multiple sampling on the integrated voltage signal of the detection line 2 and saving same. At the same time, the digital-to-analogue conversion circuit 302 can be controlled to perform analogue-to-digital conversion on the sampling points of the detection line 1 stored in the first voltage acquisition circuit.

In some embodiments, as shown in FIG. 4D, the voltage acquisition circuit 407 includes: an acquisition switch, and a holding capacitor, in which: one end of the acquisition switch is coupled to an output end of the integrator, and another end is coupled to a first end of the holding capacitor and a multi-path channel selection switch 408; as shown in FIG. 4C, CDS (compact digital switch) may be used as an acquisition switch; a first end of the holding capacitor is coupled to the acquisition switch and a second end of the holding capacitor is coupled to the grounding end.

As shown in FIG. 4D, a multi-path channel selection switch 408, one end of which is coupled to a plurality of voltage acquisition circuits 407, and another end of which is coupled to a digital-to-analogue conversion circuit 302, is configured to conduct a voltage acquisition circuit which save sampling points of a detection line at a specified timing that a current detection circuit 201 performs current detection on performs current detection on the next detection line of the detection lines; in some embodiments, the specified timing is before the integrated voltage signal of the next one of the detection lines 102 is sampled by the integration sub-circuit 301 and after the multiplexing control switch 202 corresponding to the next one of the detection lines 102 is in an on state. In the implementation, the time for sampling the sampling point of the previous detection line does not overlap with the time for sampling the next detection line. In some embodiments, the multi-path channel selection switch 408 may be a MUX switch that is easily implemented with the same fabrication process as the multiplexing control switch 202.

Figure 13:
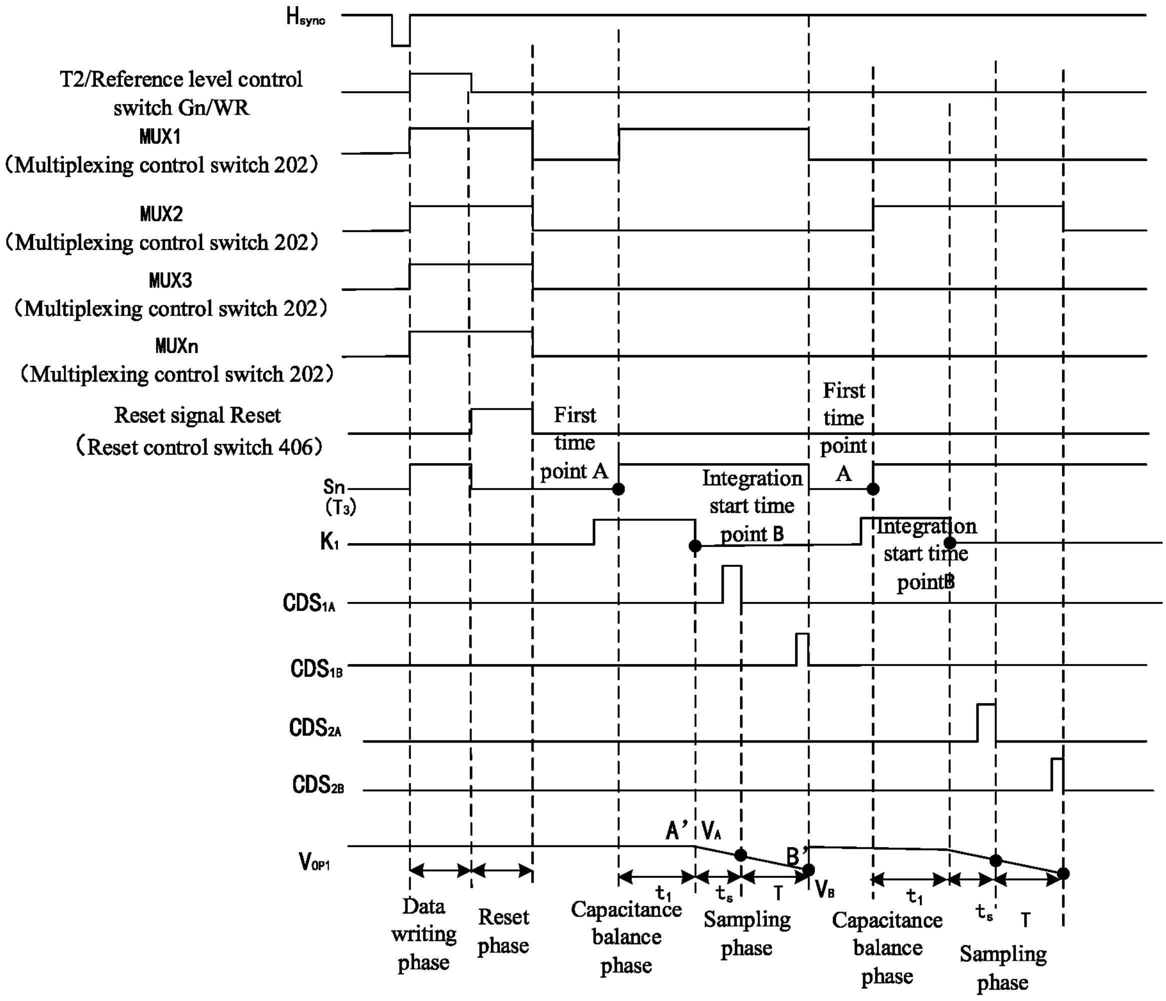
FIG. 13 is a timing diagram of a current detection apparatus provided in an embodiment of the present disclosure.

For example: since the operations in the data writing phase and the reset phase are the same, the description thereof will not be repeated here; as shown in the timing diagram in FIG. 13, when the nth detection line is detected, the multiplexing control switch $MUX_n$ 202 corresponding to the nth detection line and the sensing control switch 303 in the corresponding pixel circuit are turned on; in the sampling phase, the collecting switches $CDS_{1A}$ and $CDS_{1B}$ are turned on at different integrated time points, and the obtained voltages are respectively stored in the holding capacitors $C_{1A}$ and $C_{1B}$; when the (n+1)th detection line is detected, the multiplexing control switch $MUX_n$ 202 of the (n+1)th detection line is turned off, and the multiplexing control switch $MUX_{n+1}$ 202 corresponding to the (n+1)th detection line and the sensing control switch 303 in the corresponding pixel circuit are turned on; and at any phase before the sampling phase for the (n+1)th detection line, the multi-path channel selection switch 408 MUX can be enabled to gate the collecting switches $CDS_{1A}$ and $CDS_{1B}$, and the voltages in the holding capacitors $C_{1A}$ and $C_{1B}$ will pass through the multi-path channel selection switch 408 MUX to the voltage difference determination circuit.

Figure 4E:
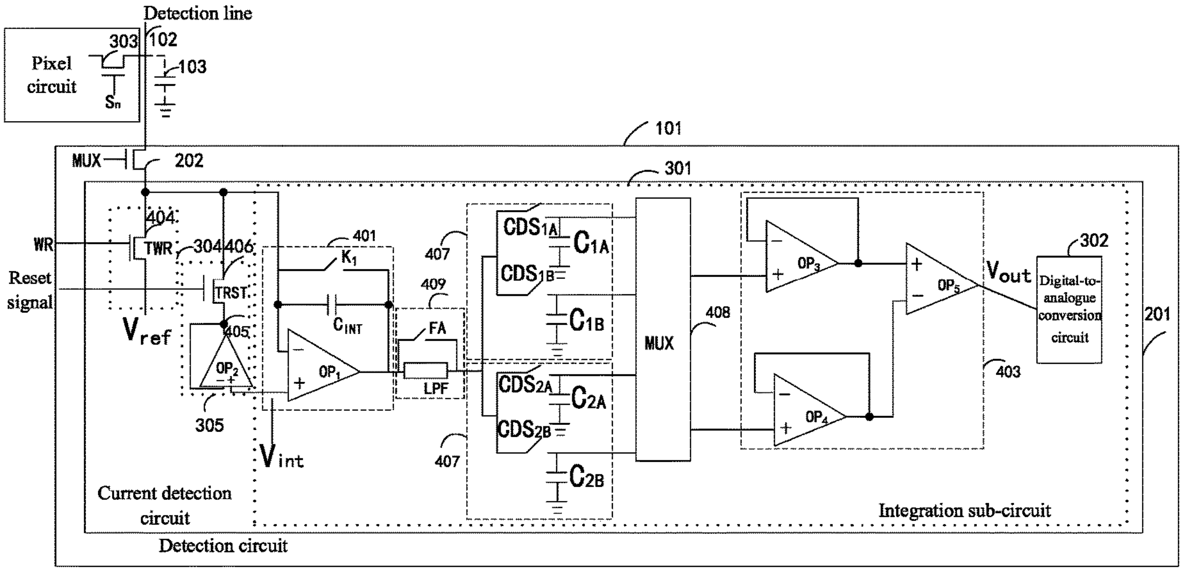
FIG. 4E is an overall schematic diagram of a current detection apparatus provided in an embodiment of the present disclosure.
Figure 4F:
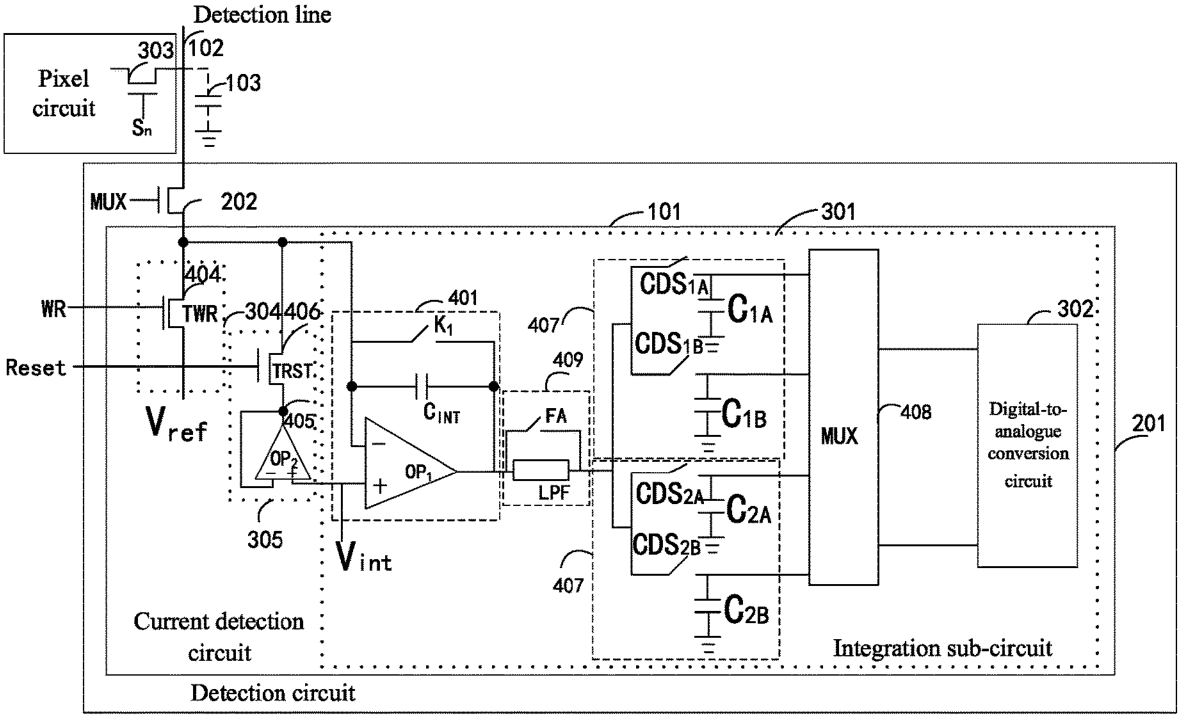
FIG. 4F is an overall schematic diagram of a current detection apparatus provided in an embodiment of the present disclosure.

In the embodiment of the present application, as shown in FIG. 4F, in order to facilitate controlling parameters of electronic devices in the integration sub-circuit 301, a protection circuit 409 is provided between the integrator 401 and the voltage acquisition circuit 407, wherein the protection circuit 409 comprises a resistance module and a control switch which are arranged in parallel, wherein the control switch may be a factory auto (FA); the resistance module may be a low pass filter (LPF). When it is necessary to adjust the parameters of the electronic devices in the integration sub-circuit 301, the adjustment of the parameter of the electronic device in the integration sub-circuit 301 can be realized by adjusting the resistance value of the resistance module LPF. The control switch FA is turned on prior to the sampling phase when current sensing is performed on the detection line 102.

In some embodiments, since the voltage can be directly calculated by the digital-to-analogue conversion circuit 302 so as to obtain a voltage difference, as shown in FIG. 4E, a voltage difference determination circuit may not be provided in the current detection apparatus; when the nth detection line is detected, in a sampling phase, sampling control switches $CDS_{1A}$ and $CDS_{1B}$ are turned on at different integrated time points, and the obtained voltages are respectively stored in storage capacitors $C_{1A}$ and $C_{1B}$; when the (n+1)th detection line is detected, before the sampling phase, the multiplexing control switch 202 MUX gates the sampling control switches $CDS_{1A}$ and $CDS_{1B}$, and at this time, the voltages in the storage capacitors $C_{1A}$ and $C_{1B}$ will be digital-to-analogue converted via the multiplexing control switch 202 MUX into the digital-to-analogue conversion circuit 302, and at the same time, the sampling control switches $CDS_{2A}$ and $CDS_{2B}$ are turned on at different integrated time points, and the obtained voltages are respectively stored in the storage capacitors $C_{2A}$ and $C_{2B}$.

Having described the current detection apparatus according to an embodiment of the present disclosure, a current detecting method applied to the current detection apparatus according to the embodiment of the present disclosure will be described in detail with reference to the accompanying drawings.

The current detection method provided by the present disclosure may include the following parts: A data writing phase of writing the grayscale voltage $V_{data}$ on the pixel circuit as shown in FIG. 1A to the drive transistor $T_1$, a reset phase of resetting the voltage on the detection line 102 from the reference voltage $V_{ref}$ to the initial voltage $V_{int}$, an integration phase of performing an integration operation on the detection line 102, and a calculation phase of determining the current on the detection line 102 according to the output voltage. These main parts are described separately below.

Figure 5A:
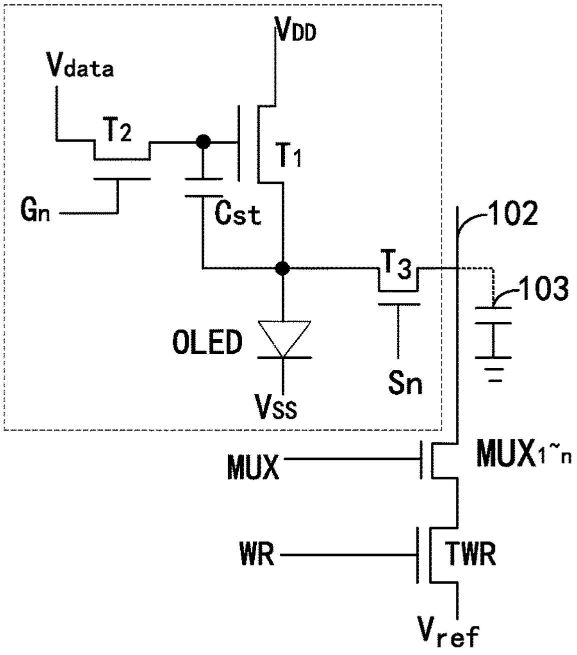
FIG. 5A is a circuit diagram of a data writing phase of a current detection apparatus provided in an embodiment of the present disclosure.
Figure 5B:
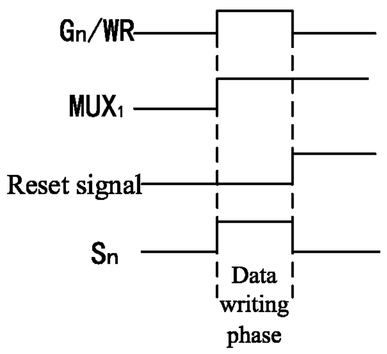
FIG. 5B is a timing diagram of a data writing phase of a current detection apparatus provided in an embodiment of the present disclosure.

As shown in the circuit diagram of FIG. 5A and the timing diagram of FIG. 5B, in the data writing phase, the gate electrode level $G_n$ (namely, $G_n$ in FIG. 1A) of the first switch transistor $T_2$ and the gate electrode control level Sn (namely, Sn in FIG. 1A) of the sensing control switch 303 ($T_3$), the gate control signal MUX of the multiplexing control switches 202 ($MUX_{1-n}$) and the gate electrode control level WR of the reference level control switch 404 (TWR) are all at a high level (as shown in FIG. 5B); the first switching transistor $T_2$, the reference level control switch 404 (TWR), the sensing control switch 303 ($T_3$) and the multiplexing control switches 202 ($MUX_{1-n}$) of the pixel circuit (shown in the dashed box in FIG. 5A) are now in the on state.

As shown in FIG. 5A, the grayscale voltage $V_{data}$ on the pixel circuit is written into the gate electrode G of the drive transistor $T_1$ in the pixel circuit via a first switch transistor $T_2$, and at the same time, a reference voltage $V_{ref}$ is written into a source phase S of the drive transistor $T_1$ via a reference level control switch 404 (TWR), a detection line 102 and a sensing control switch 303 ($T_3$); at this time, the voltage of a gate-source port of a $T_1$ tube is as shown in formula (4):

$$V_{GS} = V_{data} - V_{ref}; \qquad \text{formula (4)}$$

where $V_{GS}$ is a voltage of a gate-source port of a $T_1$ tube, $V_{data}$ is a grayscale voltage on a pixel circuit, and $V_{ref}$ is a reference voltage, and at the same time, the reference voltage $V_{ref}$ is saved in a storage capacitor $C_{st}$ of the pixel circuit.

After the first switching transistor $T_2$ is in an off state, the output current of the drive transistor $T_1$ is driven by the voltage on the storage capacitor $C_{st}$ as shown in formula (5):

$$I_{T1} = \frac{1}{2}\mu C_{OX}\frac{W}{L}(V_{data} - V_{ref} - V_{TH})^2; \qquad \text{formula (5)}$$

where $I_{T1}$ is an output current of the drive transistor $T_1$, μ represents the mobility, Cox represents the gate oxide capacitance, W represents the width of the channel of the drive transistor $T_1$, and L represents the length of the channel of the drive transistor $T_1$. $V_{TH}$ represents the threshold voltage of the drive transistor $T_1$, $V_{data}$ represents the grayscale voltage across the pixel circuit, and $V_{ref}$ represents the reference voltage.

Figure 6A:
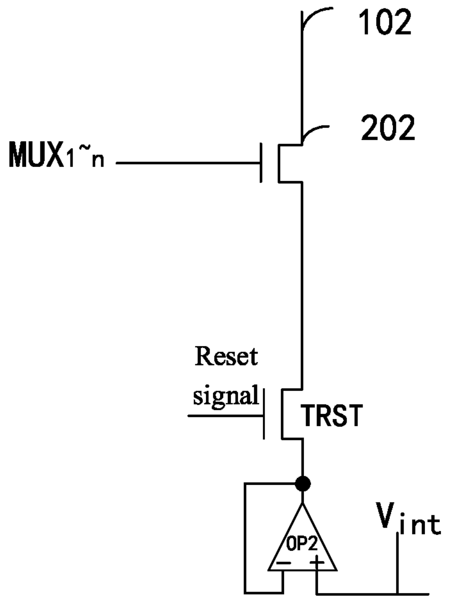
FIG. 6A is a circuit diagram of a reset phase of a current detection apparatus provided in an embodiment of the present disclosure.
Figure 6B:
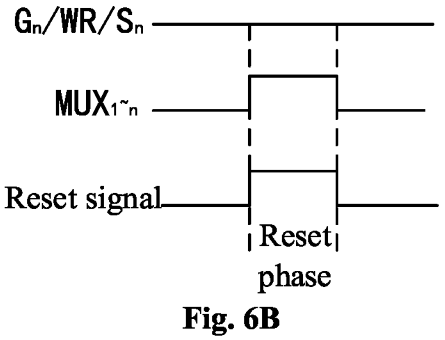
FIG. 6B is a timing diagram of a reset phase of a current detection apparatus provided in an embodiment of the present disclosure.

As shown in the circuit diagram of FIG. 6A and the timing diagram of FIG. 6B, the voltage on the reference level control switch 404 (TWR in FIG. 6A) and the detection line 102 during the data writing phase is the reference voltage $V_{ref}$. Since the low noise operational amplifier $OP_1$ (not shown in FIG. 6A) in the integrator 401 requires the voltage on the detection line 102 to be the initial voltage $V_{int}$ when performing the integration operation, the voltage on the detection line 102 needs to be reset from the reference voltage $V_{ref}$ to the initial voltage $V_{int}$ in advance by the reset circuit 305 (TRST).

In the reset process, the gate electrode level $G_n$ of the first switch transistor $T_2$, the gate electrode control level Sn of the sensing control switch 303 and the gate electrode control level WR signal of the reference level control switch 404 are low (as shown in FIG. 6B), the multiplexing control switch 202 and the reset signal (Reset) are high, the multiplexing control switch 202 and the reset control switch 406 (TRST) are in an on state, and the initial voltage $V_{int}$ resets the control switch 406 (TRST) through the follower amplifier $OP_2$; the multiplexing control switch 202 charges the detection line 102, resetting the level of the detection line 102 from the reference voltage $V_{ref}$ of the data writing phase to the initial voltage $V_{int}$.

As shown in FIGS. 4B and 4D, when the integrating control switch $K_1$ of the integrator 401 is in an on state, the third end and the second end of the low noise operational amplifier $OP_1$ are short-circuited, the integrating capacitor $C_{INT}$ is short-circuited, the charge on the integrating capacitor $C_{INT}$ is reset to 0, and at the same time, the working state of the low noise operational amplifier $OP_1$ is the state of the follower, and the voltage at the third end of the low noise operational amplifier $OP_1$ is the initial voltage $V_{int}$ at the second end.

Since there is a junction capacitance at the gate-source port of the sensing control switch 303 ($T_3$) of the pixel circuit, when the gate electrode control level Sn of the sensing control switch 303 rises from a low level to a high level, the charge on the junction capacitance is released to the detection line 102, thereby causing the output of the integration sub-circuit 301 to jump.

Figure 9:
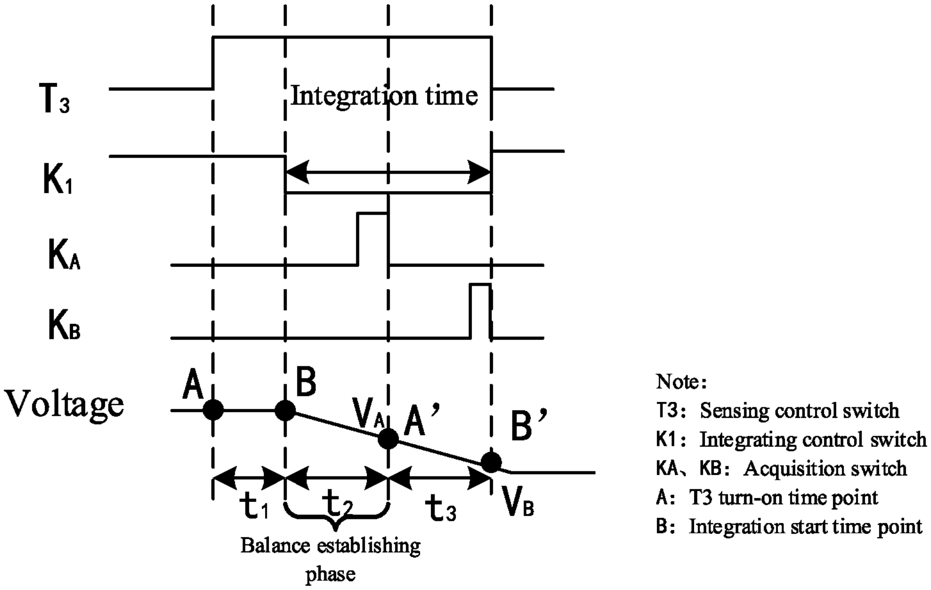
FIG. 9 is a timing diagram of a current detection apparatus provided in an embodiment of the present disclosure for turning on a sensing control switch at a time $t_1$ prior to the integration operation.

Therefore, as shown in FIGS. 4B, 4D and 9, it is necessary to ensure that the integrating control switch $K_1$ is in an on state before the integration operation of the integration sub-circuit 301 is started, reset the junction capacitance existing at the gate-source port of the sensing control switch 303, the detection line 102, the junction capacitance existing at the gate-source port of the multiplexing control switch 202, etc., and reset to the initial voltage $V_{int}$. The reset time period is set to be the time period from when the sensing control switch 303 is turned on to when the integrating control switch $K_1$ is turned on, and is marked as $t_1$. It needs to be known that $t_1$ is determined by a person skilled in the art according to experience, and $t_1$ is related to parameters such as the junction capacitance existing in the gate-source port of the sensing control switch 303 and the junction capacitance existing in the gate-source port of the multiplexing control switch 202.

Figure 12:
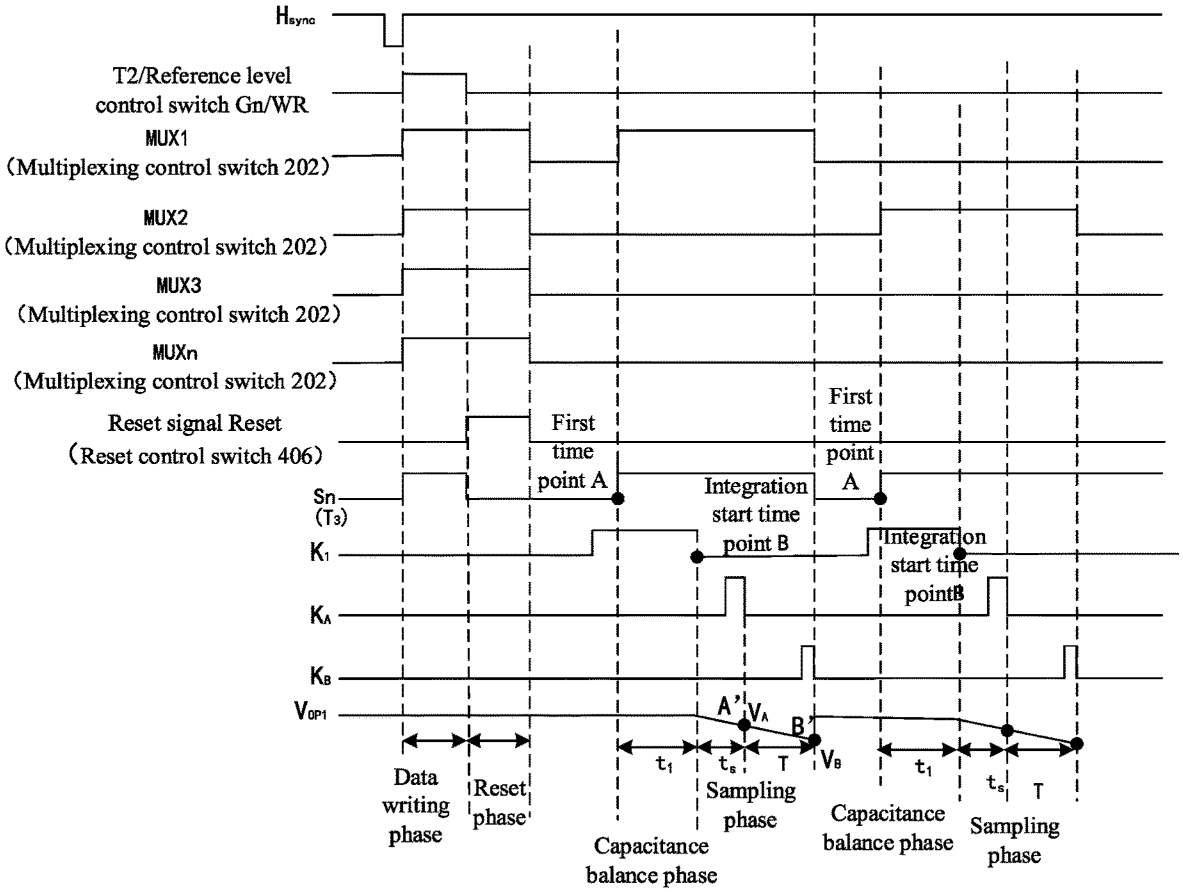
FIG. 12 is a timing diagram of a current detection apparatus provided in an embodiment of the present disclosure.

The sampling phase will first be described based on the circuit diagram shown in FIG. 4B and the timing diagram shown in FIG. 12: at the time point B from the start of integration, the integrating control switch $K_1$ is turned on and off, the low noise operational amplifier $OP_1$ in the integrator 401 is in an open loop integration state, the multiplexing control switch 202 (MUX is at a high level in FIG. 12) and the sensing control switch 303 (Sn is at a high level in FIG. 12) are turned on, and the driving current output by the drive transistor $T_1$ under the action of the voltage stored on the storage capacitor $C_{st}$ passes through the sensing control switch 303, the detection line 102, and the multiplexing control switch 202 (MUX) to the integrating capacitor $C_{INT}$. As shown in FIG. 12, the output voltage $V_{OP1}$ of the integrator decreases with time when $K_1$ switches from an on state to an off state. After $t_s$, the output voltage $V_{OP1}$ of the integrator drops from $V_{int}$ to $V_A$, and $K_A$ of the voltage acquisition circuit 402 turns on to start sampling to obtain the acquired voltage $V_A$, which is stored in the capacitor $C_A$. After a further period of time T, the integrated voltage drops from $V_A$ to $V_B$, $K_B$ of the voltage acquisition circuit 402 conducts, and the voltage $V_B$ is acquired and stored in the capacitor CB.

After $V_A$ and $V_B$ are stored in the capacitors $C_A$ and $C_B$, respectively, the voltage difference $V_{out}$ (i.e., the voltage difference between $V_A$ and $V_B$) is obtained input impedance followers $OP_3$ and $OP_4$ and a subtracter $OP_5$ as shown in formula (6a):

$$V_{out} = V_A - V_B; \quad \text{formula (6a)}$$

As shown in FIG. 4B, after receiving the output voltage, i.e., the voltage difference $V_{out}$, the digital-to-analogue conversion circuit 302 converts $V_{out}$ from an electrical signal into a digital signal and outputs same to a controller (not shown in the figure), and the controller, according to the capacitors $C_A$ and $C_B$, and the output voltage $V_{out}$ (the voltage difference from $V_A$ to $V_B$ when the time difference is T when the integrator is from the $t_s$ time point to the time point ($t_s$+T)), the average current during this time period T is as shown in formula (7a):

$$I_{T1} = \frac{C_{INT}}{T} \times (V_A - V_B); \quad \text{formula (7a)}$$

where $I_{T1}$ represents an average current in the time period T, $C_{INT}$ represents an integrating capacitor, $V_A$ represents a voltage collected by the voltage acquisition circuit 402 at a time point $t_s$, and is stored in a capacitor $C_A$, $V_B$ represents a voltage collected by the voltage acquisition circuit 402 at a time point ($t_s$+T), and is stored in a capacitor $C_B$, and T represents a time interval during which the voltage is collected by the voltage acquisition circuit twice.

In addition to the circuit diagram shown in FIG. 4B, the circuit diagram shown in FIG. 4D and the timing diagram shown in FIG. 13 can also be used. In the timing diagram shown in FIG. 13, the data writing phase, the reset phase and the capacitance balance phase are all the same as those in FIG. 12, and the description thereof will not be repeated here, and the timing diagram of the sampling phase in FIG. 13 will be described below in conjunction with the circuit diagram shown in FIG. 4D.

At the time point B from the start of integration, the integrating control switch K1 is turned on and off, the low noise operational amplifier $OP_1$ in the integrator 401 is in an open loop integration state, the multiplexing control switch 202 (MUX is at a high level in FIG. 13) and the sensing control switch 303 (Sn is at a high level in FIG. 13) are turned on, and the driving current output by the drive transistor $T_1$ under the action of the voltage stored on the storage capacitor $C_{st}$ passes through the sensing control switch 303, the detection line 102, and the multiplexing control switch 202 (MUX) to the integrating capacitor $C_{INT}$. As shown in FIG. 13, the output voltage $V_{OP1}$ of the integrator decreases with time when $K_1$ switches from an on state to an off state. After $t_s$, the output voltage $V_{OP1}$ of the integrator decreases from $V_{int}$ to $V_{1A}$, and the $CDS_{1A}$ of the voltage acquisition circuit 407 turns on to start sampling to obtain the acquired voltage $V_{1A}$, which is stored in the holding capacitor $C_{1A}$. After another T duration, the integrated voltage drops from $V_{1A}$ to $V_{1B}$, and $CDS_{1B}$ of the voltage acquisition circuit 407 turns on, acquiring the voltage $V_{1B}$ and storing same in the holding capacitor $C_{1B}$.

After $V_{1A}$ and $V_{1B}$ are respectively stored in the holding capacitors $C_{1A}$ and $C_{1B}$, the voltage difference $V_{out}$ (i.e., the voltage difference between $V_A$ and $V_B$) is obtained via the high input impedance followers $OP_3$ and $OP_4$ and the subtracter $OP_5$ as shown in formula (6b):

$$V_{out} = V_{1A} - V_{1B}; \quad \text{formula (6b)}$$

When the next detection line is detected, as shown in FIG. 4D, after receiving an output voltage, namely, a voltage difference $V_{out}$, the digital-to-analogue conversion circuit 302 converts the $V_{out}$ from an electrical signal into a digital signal and outputs same to a controller (not shown in the figure); and the controller, according to the capacitors $C_{1A}$ and $C_{1B}$ and the output voltage $V_{out}$ (an integrator, from a time point $t_s$ to a time point ($t_s$+T), and a voltage difference from $V_{1A}$ to $V_{1B}$ when the time difference is T), the average current during this time period T is as shown in formula (6c):

$$I_{T1} = \frac{C_{INT}}{T} \times (V_{1A} - V_{1B}); \quad \text{formula (6c)}$$

where $I_{T1}$ represents an average current in the time period T, $C_{INT}$ represents an integrating capacitor, $V_{1A}$ represents a voltage collected by the voltage acquisition circuit 402 at a time point $t_s$, and is stored in a capacitor $C_{1A}$; $V_{1B}$ represents a voltage collected by the voltage acquisition circuit 402 at a time point $t_s$+T, and is stored in a capacitor $C_{1B}$; and T represents a time interval between voltage collection by the voltage acquisition circuit twice. After saving a plurality of sampling points of the integrated voltage signal of the detection line 1, the multiplexing control switch 202 between the detection line 1 and the current detection circuit is set to an off state, and the multiplexing control switch 202 between the detection line 2 and the current detection circuit is set to an on state. The capacitance balance phase is started before the integration start time point B, and after the capacitance balance phase ends, the output voltage $V_{OP1}$ of the integrator decreases with time when $K_1$ switches from an on state to an off state. After $t_s$, the output voltage $V_{OP1}$ of the integrator decreases from $V_{int}$ to $V_{2A}$, and the $CDS_{2A}$ of the voltage acquisition circuit 407 turns on to start sampling so as to obtain the acquired voltage $V_{2A}$, which is stored in the holding capacitor $C_{2A}$. After another T duration, the integrated voltage drops from $V_{2A}$ to $V_{2B}$, and the $CDS_{2B}$ of the voltage acquisition circuit 407 turns on, acquiring the voltage $V_{2B}$ and storing same in the holding capacitor $C_{2B}$. After $V_{2A}$ and $V_{2B}$ are stored in holding capacitors $C_{2A}$ and $C_{2B}$, respectively, the voltage difference $V_{out}$ (i.e., the voltage difference between $V_A$ and $V_B$) is obtained via high input impedance followers $OP_3$ and $OP_4$ and a subtracter $OP_5$ as shown in formula (6d):

$$V_{out} = V_{2A} - V_{2B}; \quad \text{formula (6d)}$$

In some embodiments, the voltage acquisition circuit 402 acquires voltages at a time point t, a time point (t+T), a time point (t+2T) and a time point (t+3T), and the controller (not shown in the figure) respectively corresponds to the holding capacitors $C_A$, $C_B$ and $C_C$, $C_D$ (not shown in the figure) according to the time point t, the time point (t+T), the time point (t+2T) and the time point (t+3T); calculate the voltage difference at the time point t and the time point (t+T) and the voltage difference at the time point (t+2T) and the time point (t+3T); the average current $I_{T1}$ is determined from the voltage difference at the time point t and the time point (t+T), and the voltage difference at the time point (t+2T) and the time point (t+3T), as shown in formula (7b):

$$I_{T1} = \left[\frac{C_{INT}}{T} \times (V_A - V_B) + \frac{C_{INT}}{T} \times (V_C - V_D)\right] / 2; \quad \text{formula (7b)}$$

Figure 7:
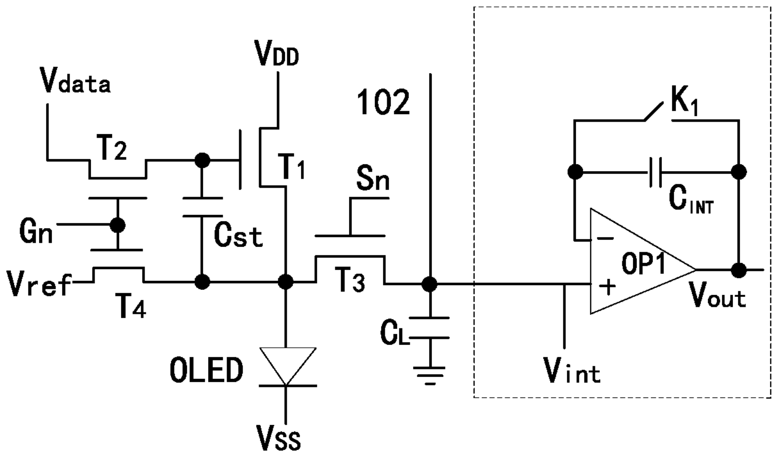
FIG. 7 is a schematic diagram of an integration module of a current detection apparatus provided in an embodiment of the present disclosure.

In the related art, in a general case, current detection is implemented using an integration module, as shown in FIG. 7, wherein a 4T1C pixel circuit comprises a drive transistor $T_1$, a first switching transistor $T_2$, a sensing control switch $T_3$ and a second switching transistor $T_4$, $C_{st}$ and OLED.

In the current sensing phase, the OLED shown in FIG. 1A does not emit light, and the current driving the transistor $T_1$ does not pass through the OLED. When the gate electrode level $G_n$ of the first switch transistor $T_2$ is a high level, writing the grayscale voltage $V_{data}$ and the reference voltage $V_{ref}$ of the pixel circuit to the gate electrode, the source electrode and the storage capacitor $C_{st}$ of the drive transistor $T_1$. When the gate electrode level $G_n$ of the first switching transistor $T_2$ is low, the $V_{data}$-$V_{ref}$ voltage is stored on the storage capacitor $C_{st}$. When the gate electrode control level Sn of the sensing control switch 303 ($T_3$) is a high level, the sensing control switch 303 ($T_3$) is in an on state, and the gate-source electrode voltage $V_{GS}$ of the drive transistor $T_1$ generates a driving current $I_D$ under the action of the voltage of the $V_{data}$-$V_{ref}$ stored at the two ends of the storage capacitor $C_{st}$ as shown in formula (8):

$$I_D = \frac{1}{2}\mu_n C_{OX}\frac{W}{L}(V_{data} - V_{ref} - V_{TH})^2 \quad \text{formula (8)}$$

The driving current $I_D$ flows to the detection line 102 and the integration sub-circuit 301, and the driving current $I_D$ generates a voltage drop on the load capacitor $C_L$, and the output voltage $V_{output}$ of the integration sub-circuit is shown in formula (9):

$$V_{output} = V_{int} - \int \frac{I_D}{C_I} dt = V_{int} - \int \frac{\frac{1}{2}\mu_n C_{OX}\frac{W}{L}(V_{data} - V_{ref} - V_{TH})^2}{C_I} dt; \quad \text{formula (9)}$$

When the driving current $I_D$ is a constant current, the above formula may be abbreviated as formula (10):

$$V_{output} = V_{int} - \frac{I_D \times t}{C_I}; \quad \text{formula (10)}$$

where μ represents mobility, cox represents gate oxide capacitance per unit area, W represents the width of the channel of the drive transistor $T_1$, and L represents the length of the channel of the drive transistor $T_1$. $V_{TH}$ represents the threshold voltage of the drive transistor $T_1$, $V_{data}$ represents the grayscale voltage of the pixel circuit, and $V_{ref}$ represents the reference voltage.

However, using the above formula, it can be found that there is a great difference between the current of the detection line 102 and the simulated current, and the smaller the current of the detection line 102, the greater the difference.

Therefore, the embodiment of the present disclosure also proposes a method for improving the accuracy of current detection based on the current detection apparatus proposed in the present disclosure, and the method for improving the accuracy of current detection provided by the embodiment of the present disclosure is described in detail below based on the integration sub-circuit 301.

Figure 8:
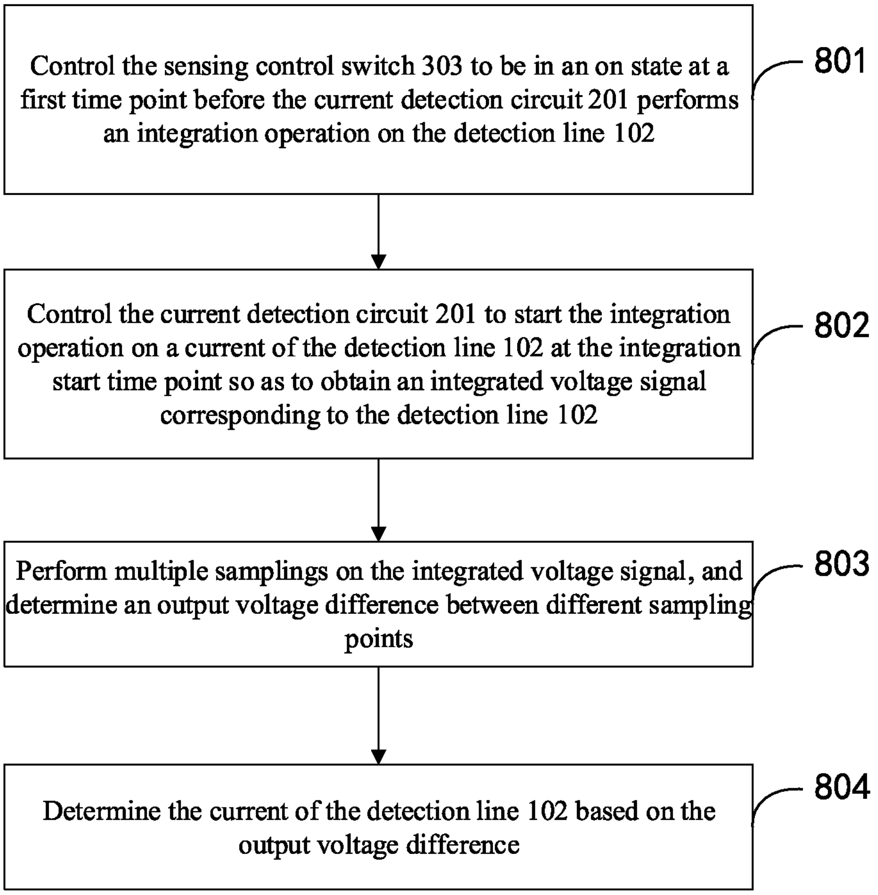
FIG. 8 is a flowchart of a control method for a current detection apparatus provided in an embodiment of the present disclosure.

Since the junction capacitance exists in the sensing control switch 303 ($T_3$), the voltage jump of the control signal MUX will cause the charge in the junction capacitance to charge and discharge to the detection line 102. In view of this, in the embodiment of the present disclosure, the steps as shown in FIG. 8 are used.

In step 801: controlling the sensing control switch 303 to be in an on state at a first time point before the current detection circuit 201 performs an integration operation on the detection line 102 (such as the time point where the first integrated time point A point in FIGS. 9 and 12 is located); a duration between the first time point and an integration start time point at which the current detection circuit 201 starts to the integration operation (such as the time point at which the second integrated time point B point in FIGS. 9 and 12 is located) being a first duration. In some embodiments, as shown in FIG. 9, the first duration is $t_1$, and the sensing control switch 303 is turned on at $t_1$ before the integration operation.

In step 802: controlling the current detection circuit 201 to start the integration operation on a current of the detection line 102 at the integration start time point so as to obtain an integrated voltage signal corresponding to the detection line 102.

In step 803: performing multiple samplings on the integrated voltage signal, and determining an output voltage difference between different sampling points.

In step 804: determining the current of the detection line 102 based on the output voltage difference.

In some embodiments, the first duration is related to factors including, but not limited to: a transition voltage between the gate electrode and the source electrode of the multiplexing control switch 202, a parasitic capacitance between the gate electrode and the source electrode of the multiplexing control switch 202, a parasitic capacitance of the detection line 102, a load capacitance 103 corresponding to the integration sub-circuit 301 and the detection line 102, a threshold voltage shift due to device ageing, etc. According to the experience of a person skilled in the art, the first duration is typically 2-4 microseconds, and may be, for example, 2, 2.5, 3.5, or 4 microseconds.

Using the method described above in the disclosed embodiment, the conduction of the sensing control switch

303 ($T_3$) prior to the integration operation effectively avoids junction capacitance induced errors in the sensed current.

Ideally, the output voltage of the integration sub-circuit 301 is linear with the integration time, but since the parasitic load capacitor 103 present on the detection line 102 and the open loop amplification of the integrator 401 cannot be infinite, there is a capacitance balancing process on the detection line 102 at the initial phase of integration. In this process, the curve of output voltage and integration time shifts the linear relationship. In order to improve the accuracy of detection, the capacitance balance process should be avoided.

In view of this, in an embodiment of the present disclosure, a duration between a time point when the integrated voltage signal is first sampled and an integration start time point is a second duration, and the second duration is greater than or equal to a duration for establishing balance, wherein the duration for establishing balance is a duration required for the sensing control switch, the detection circuit and establishing stable balance with the detection line. The second duration can be used to charge the load capacitor until the load capacitor is in a balanced state before the integration operation of the integration sub-circuit 301 on the detection line 102; the second duration is shown as $t_2$ in FIG. 9, and according to the experience of a person skilled in the art, the second duration may generally be about 10 microseconds, for example, 8, 9, 10, 11 microseconds.

In some embodiments, the integration operation may begin during the $t_3$ phase as shown in FIG. 9, with the acquisition switch $K_A$ conducting, at the time point A', the voltage $V_A$ at the time point A' is stored in the holding capacitor $C_A$, with the acquisition switch KB conducting, and at the time point B', the voltage $V_B$ at the time point B' is stored in the holding capacitor $C_B$. Thus, the voltage difference between the time point A' and the time point B' can be obtained.

In some embodiments, the second duration is inversely related to the current of the detection line 102, i.e., the smaller the current of the detection line 102, the longer the second duration.

Another important factor affecting the accuracy of current detection is the presence of leakage current in the circuit, as shown in Table 1, which shows the results of leakage current cases obtained by simulation experiments:

TABLE 1

| $V_{GS}$ | $C_{INT}$ | Integration duration | $T_1$ current | Output voltage | $C_{INT}$ Current | Errors |
|---|---|---|---|---|---|---|
| 1.0 V | 0.25 pF | 5 ms | 0.031 nA | 4.0959 V | 0.005 nA | 83.87% |
| 1.2 V | 0.25 pF | 5 ms | 0.228 nA | 4.0929 V | 0.155 nA | 32.02% |
| 1.4 V | 0.25 pF | 5 ms | 1.08 nA | 4.0795 V | 0.825 nA | 23.64% |
| 1.6 V | 0.25 pF | 5 ms | 3.665 nA | 4.0401 V | 2.795 nA | 22.86% |
| 1.8 V | 0.25 pF | 5 ms | 9.743 nA | 3.9457 V | 7.515 nA | 22.68% |
| 2.0 V | 0.25 pF | 5 ms | 21.37 nA | 3.7656 V | 16.52 nA | 22.57% |
| 2.2 V | 0.25 pF | 5 ms | 40.26 nA | 3.4725 V | 31.18 nA | 22.73% |
| 2.4 V | 0.25 pF | 5 ms | 67.4 nA | 3.0545 V | 52.08 nA | 22.46% |
| 2.5 V | 0.25 pF | 5 ms | 102.8 nA | 2.502 V | 79.7 nA | 22.58% |

In the table, the $V_{GS}$ column is the voltage difference between the gate electrode voltage and the source electrode voltage of the drive transistor $T_1$, V is a voltage unit volt (V); $C_{INT}$ is the integrating capacitance, pF is the unit picofarad of capacitance; nA is the current in nanoamps.

Figure 10A:
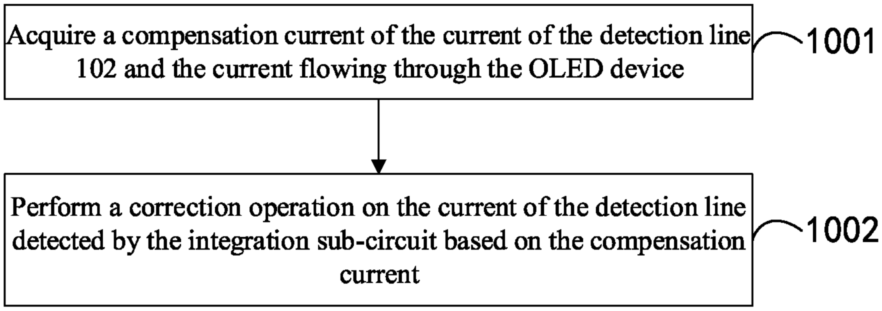
FIG. 10A is a flowchart of current correction of a current detection apparatus provided in an embodiment of the present disclosure.

It can be seen from the experimental data in the above table and the gate-source electrode voltage formula $V_{GS}=V_{data}-V_{ref}$ of the drive transistor $T_1$ in the pixel circuit that, under different grayscale voltages $V_{data}$, the error between the actual detected current of the detection line and the actual simulated current is close to 22%, and the error is greater under a small current. Therefore, in the embodiment of the present disclosure, after determining the current of the detection line 102 according to the output voltages respectively corresponding to the specified integration duration if there is a leakage current in the circuit, if the current of the detection line 102 is less than a preset value, a compensation current of the detection line 102 is acquired; a correction operation is performed on the current of the detection line 102 based on the compensation current. Wherein the preset value is the current of the detection line 102 calculated through the experimental parameters, namely, if the measured current is less than the calculated current, there is a leakage current, and at this moment, the method as shown in FIG. 10A is used to correct the current; it needs to be known that if there is no leakage current in the circuit (namely, the measured current is equal to the calculated current), there is no need to correct the current;

As shown in FIG. 10A, in step 1001: acquiring a compensation current of the current of the detection line 102 and the current flowing through the OLED device.

In some embodiments, the method of determining the compensation current may be implemented as:

writing a drive voltage into a drive transistor $T_1$ in a pixel circuit corresponding to a detection line 102, wherein a gate-source voltage between the gate electrode and the source electrode of the drive transistor $T_1$ is less than a threshold voltage $V_{th}$ of the drive transistor $T_1$; transmitting zero current to the detection line 102; at this time, the current of the detection line 102 detected by the current detection apparatus is used as the compensation current.

In some embodiments, the value of the drive voltage may be determined based on the value of the parameter of the detection line 102, and the parameter of the detection line 102 when the drive voltage corresponding to the detection line 102 is obtained is consistent with the parameter of the integration sub-circuit 301 when the current of the detection line 102 is detected. In specific implementation, it can be specifically set by a person skilled in the art according to practical application scenarios.

In another embodiment, the drive voltage corresponding to the detection line 102 can also be determined according to the parameters of the detection line 102 when the current compensation is performed on the detection line 102 for the first time and stored in a database (not shown in the figure), and then the drive voltage corresponding to the detection line 102 on the detection line 102, the drive voltage corresponding to the detection line 102 is directly obtained in the database and the current compensation is performed according to the drive voltage.

In step 1002: performing a correction operation on the current of the detection line 102 detected by the integration sub-circuit 301 based on the compensation current. That is, the actual current on the detection line 102 is the sum of the detected current and the compensation current.

It will be appreciated by those skilled in the art that any of the methods provided by the embodiments of the present disclosure described above can be used when it is desired to improve current accuracy, and that a variety of methods can be used depending on the application.

Figure 10B:
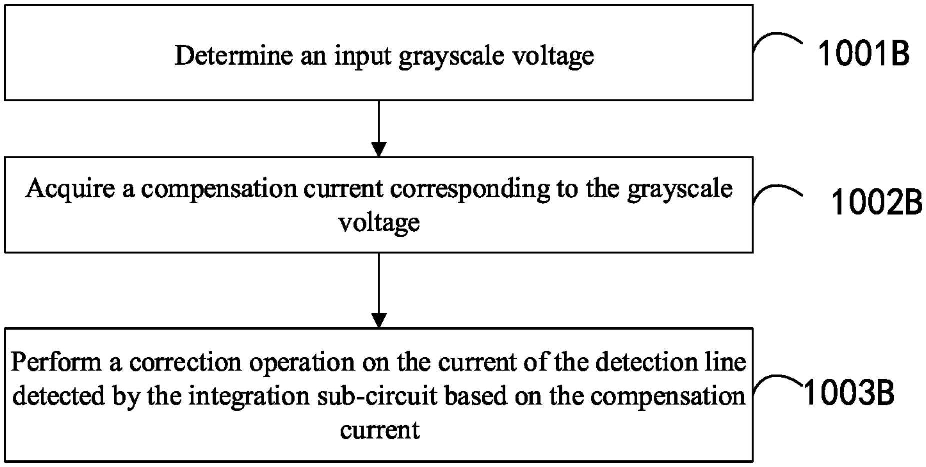
FIG. 10B is a flowchart of current correction at different grayscales of a current detection apparatus provided in an embodiment of the present disclosure.

At different grayscale voltages, corresponding compensation currents can be obtained for each grayscale voltage. In the implementation, as shown in FIG. 10B, a flowchart for compensating the detected current includes the following steps.

In step 1001B: determining an input grayscale voltage.

In step 1002B: acquiring a compensation current corresponding to the grayscale voltage.

In step 1003B: performing a correction operation on the current of the detection line 102 detected by the integration sub-circuit 301 based on the compensation current.

As shown in Table 2, the simulation data of the embodiment of the present disclosure obtained by using the current detection apparatus and the method for compensation current provided by the present disclosure as described above:

TABLE 2

| $V_{GS}$ | $C_{INT}$ | Integration duration | $T_1$ current | First acquired output voltage | Second captured output voltage | Detection current | Compensation current | Accuracy |
|---|---|---|---|---|---|---|---|---|
| 1.0 | 0.0625 pF | 10 ms | 0.0001 nA | 4.0131 V | 4.047 V | −0.05297 nA | 0 nA | |
| 2.1 V | 0.0625 pF | 10 ms | 0.082 nA | 3.9936 V | 3.9978 V | 0.025 nA | 0.078 nA | 94.99% |
| 2.3 V | 0.0625 pF | 10 ms | 0.475 nA | 3.897 V | 3.6382 V | 0.406 nA | 0.459 nA | 96.61% |
| 2.5 V | 0.0625 pF | 10 ms | 1.911 nA | 3.5482 V | 2.3868 V | 1.815 nA | 1.868 nA | 97.73% |
| 2.7 V | 0.0625 pF | 10 ms | 6.152 nA | 3.4768 V | 2.5099 V | 6.043 nA | 6.096 nA | 99.09% |
| 2.9 V | 0.0625 pF | 10 ms | 15.81 nA | 2.6508 V | 0.13219 V | 15.79 nA | 15.79 nA | 99.91% |

In the table, the $V_{GS}$ column is the voltage difference between the gate electrode voltage and the source electrode voltage of the drive transistor $T_1$, V is a voltage unit volt (V); $C_{INT}$ is the integrating capacitance, pF is the unit picofarad of capacitance; nA is the current in nanoamps.

It can be seen from table 2 that the accuracy of the detected current is significantly improved in the case of a small current after current compensation.

In order to facilitate understanding, the overall structure of the current detection apparatus according to the embodiment of the present disclosure will be described in detail as follows:

As shown in FIG. 11, an example of a detection circuit detecting three detection lines is described, and FIG. 11 comprises: a detection line 102 sense 1-sense3, a first multiplexing control switch 202 (MUX1), a second multiplexing control switch 202 (MUX2), a third multiplexing control switch 202 (MUX3), a load capacitor 103 $C_{SL}$, a low noise operational amplifier $OP_1$, a reset switch $K_1$, an integrating capacitor $C_{INT}$, acquisition switches $K_A$ and $K_B$, holding capacitors $C_A$ and $C_B$, followers $OP_3$ and $OP_4$ with a high input impedance, a subtracter $OP_5$, resistors R1, R2, R3 and R4, a digital-to-analogue conversion circuit 302, a reference level control switch 404 (TWR), a reset control switch 406 (TRST), a follower amplifier $OP_2$, and a pixel circuit; wherein the pixel circuit is provided with: A first switching transistor $T_2$, a drive transistor $T_1$, a sensing control switch 303 ($T_3$), capacitors $C_{st}$ and OLED (only the sensing control switch 303 in the pixel circuit is shown in FIG. 11).

As shown in the timing diagram of FIG. 12: in the data writing phase, the gate electrode $G_n$ and the writing voltage of the sensing control switch 303 ($T_3$) corresponding to the detection line 102 and the Sn signal are high, and at this time, the first switching transistor $T_2$ and the reference level control switch 404 (TWR) are in an on state.

In the reset phase, the detection voltage of the detection line 102 is $V_{ref}$, and thus the multiplexing control switch 202 (MUX1) corresponding to the detection line 102 is in an on state. The reset signal Reset is at a high level, and at this time, the reset control switch 406 (TRST tube) is in an on state. The detection line 102 voltage is reset to the initial voltage $V_{int}$.

In the capacitance balance phase ($t_1$), the sensing control switch 303, the multiplexing control switch 202 and the reset switch $K_1$ are in an on state.

In the sampling phase ($t_s$+T), the sampling is started by turning on the acquisition switch $K_A$, and at the time point A', the voltage $V_A$ is collected and stored in the holding capacitor $C_A$. After T time, the voltage acquisition circuit turns on the acquisition switch $K_B$ to perform sampling, and at the time point B', the voltage $V_B$ is acquired and stored in the holding capacitor $C_B$.

The operation of a current detection circuit for detecting a plurality of detection lines will be described with reference to FIGS. 1A, 11 and 12. Assume that the plurality of detection lines are detection lines 1-n, respectively. The pixel circuits to which the detection lines 1-n are respectively coupled simultaneously perform a data writing phase and a reset phase. After the reset phase is over, if it is necessary to detect the detection line 1, only the first multiplexing control switch 202 ($MUX_1$) to which the detection line 1 is coupled is left in an on state to turn off the multiplexing control switch of the detection line 2-n. Then, capacitance balance phase and sampling phase is then performed only on the detection line 1 in order to complete the current sensing on the detection line 1. After completing current detection on the detection line 1, turning off the first multiplexing control switch 202 ($MUX_1$) coupled to the detection line 1, and if detection on the detection line 2 is required, turning on the second multiplexing control switch 202 ($MUX_2$) coupled to the detection line 2, and then completing a capacitance balance phase and a sampling phase on the detection line 2, thereby completing current detection on the detection line 2. By analogy, if it is necessary to detect the detection line m (m is any one of the above-mentioned n detection lines), only the m-th multiplexing control switch 202 ($MUX_m$) coupled to the detection line m is kept in an on state, and then the capacitance balance phase and the sampling phase of the detection line m are completed, thereby completing the current detection of the detection line m. Thus, current detection is performed individually for each detection line in sequence until n detection lines are detected.

Taking the detection line 1 as an example, each phase of each detection line will be described: in a data writing phase, a sensing control switch 303 ($T_3$) in a pixel circuit 1 coupled to a detection line 1 is turned on, a first switch transistor $T_2$ in the pixel circuit 1 is turned on, at the same time, a reference level control switch 404 (TWR) in a current detection circuit is in a turned-on state, a first multiplexing control switch 202 ($MUX_1$) coupled to the detection line 1 is in a turned-on state, and a potential of a source electrode of a drive transistor $T_1$ in the pixel circuit 1 is a reference voltage $V_{ref}$, in a reset phase, a first switch transistor $T_2$ in the pixel circuit 1 and a sensing control switch 303 ($T_3$) in the pixel circuit 1 which is coupled to the detection line 1 are cut off, and at the same time, a reset control switch 406 (a TRST tube) is in an on state, and the potential on the detection line 1 is an initial voltage $V_{int}$; in a capacitance balance phase, the reset control switch 406 (the TRST tube) is cut off, and at a first time point A before the start of integration, the first multiplexing control switch 202 (the $MUX_1$) and the reset switch $K_1$ are in an on state; after the sampling phase, the sampling starts by turning on the acquisition switch $K_A$, and at the time point A', the voltage $V_A$ is collected and stored in the holding capacitor $C_A$. After T time, the voltage acquisition circuit turns on the acquisition switch $K_B$ to perform sampling, and at the time point B', the voltage $V_B$ is acquired and stored in the holding capacitor $C_B$; and determining the current of the detection line according to the voltage difference between the time point A' and the time point B'.

Therefore, when detecting the detection line 2 corresponding to the second multiplexing control switch 202 ($MUX_2$), there is no need to perform two phases of data writing and resetting again, and in the capacitance balance phase, the reset control switch 406 (TRST tube) is cut off; at a first time point A before the start of the second integration, the second multiplexing control switch 202 ($MUX_2$) and the reset switch $K_1$ are in an on state; in the sampling phase, the sampling starts by turning on the acquisition switch $K_A$, and at the time point A', the voltage $V_A$ is sampled and stored in the holding capacitor $C_A$. After T time, the voltage acquisition circuit turns on the acquisition switch $K_B$ to perform sampling, and at the time point B', the voltage $V_B$ is acquired and stored in the holding capacitor $C_B$; and determining the current of the detection line according to the voltage difference between the time point A' and the time point B'.

By analogy, extending to the case where a detection circuit couples n detection lines and n pixel circuits, the operation process is as follows.

When the detection line 1 coupled to the first multiplexing control switch 202 ($MUX_1$) is detected, in a data writing phase, the sensing control switch 303 ($T_3$) coupled to the detection line 102, the first switching transistor $T_2$ respectively corresponding to the pixel circuit 1, the pixel circuit 2, the pixel circuit 3. the pixel circuit n are turned on, and at the same time, the reference level control switch 404 (TWR) in the current detection circuit is in a turned-on state, and the first multiplexing control switch 202 ($MUX_1$) coupled to the detection line 1; the second multiplexing control switch 202 ($MUX_2$) coupled to the detection line 2, a third multiplexing control switch 202 ($MUX_3$) coupled to the detection line 3, and an nth multiplexing control switch 202 ($MUX_n$) coupled to the detection line n are all in an on state. The potentials of the source electrode of the drive transistor $T_1$ in the pixel circuit 1, the source electrode of the drive transistor $T_1$ in the pixel circuit 2, the source electrode of the drive transistor $T_1$ in the pixel circuit 3, . . . , the source electrode of the drive transistor $T_1$ in the pixel circuit n are all reference voltages $V_{ref}$, in a reset phase, the first switch transistor $T_2$ and the sensing control switch 303 ($T_3$) in the pixel circuit 1, the first switch transistor $T_2$ and the sensing control switch 303 ($T_3$) in the pixel circuit 2, the first switch transistor $T_2$ and the sensing control switch 303 ($T_3$) in the pixel circuit 3, . . . , the first switch transistor $T_2$ and the sensing control switch 303 ($T_3$) in the pixel circuit n are all cut off; at the same time, the reset control switch 406 (the TRST tube) is in an on state, and the potentials on the detection line 1, the detection line 2, the detection line 3, . . . , and the detection line n are all reset to the initial voltage $V_{int}$; when current detection is performed on a detection line 1 coupled to the first multiplexing control switch 202 ($MUX_1$), the reset control switch 406 (a TRST tube) is cut off during a capacitance balance phase; the first multiplexing control switch 202 ($MUX_1$) is in an on state, and the multiplexing control switch 202 (MUX) corresponding to other detection lines is in an off state; at a first time point A before the start of the first integration, the multiplexing control switch 202 ($MUX_1$) and the reset switch $K_1$ are in an on state; after the capacitance balance phase, the sampling starts by turning on the acquisition switch $K_A$, and at the time point A', the voltage $V_A$ is collected and stored in the holding capacitor $C_A$. After T time, the voltage acquisition circuit turns on the acquisition switch $K_B$ to perform sampling, and at the time point B', the voltage $V_B$ is acquired and stored in the holding capacitor $C_B$; and determining the current of the detection line according to the voltage difference between the time point A' and the time point B'.

When the detection line 2 is detected, the second multiplexing control switch 202 ($MUX_2$) is in an on state, and the multiplexing control switch 202 (MUX) corresponding to the other detection lines is in an off state; at a first time point A before the start of the second integration, the second multiplexing control switch 202 ($MUX_2$) and the reset switch $K_1$ are in an on state; after the capacitance balance phase, the sampling starts by turning on the acquisition switch $K_A$, and at the time point A', the voltage $V_A$ is collected and stored in the holding capacitor $C_A$. After T time, the voltage acquisition circuit turns on the acquisition switch $K_B$ to perform sampling, and at the time point B', the voltage $V_B$ is acquired and stored in the holding capacitor $C_B$; and determining the current of the detection line according to the voltage difference between the time point A' and the time point B'. The detection process for the n detection lines coupled to the detection circuit is the same and will not be described later.

It can be realized that multiplexing the same current detection apparatus can realize current detection on multiple detection lines; the present application does not define the number of multiplexing control switches 202 (MUX) and detection lines 102, and the method when detecting detection lines corresponding to subsequent multiplexing control switches 202 ($MUX_3$-n) is the same as the method when detecting detection lines corresponding to $MUX_1$ and $MUX_2$, and therefore the subsequent description is not repeated; however, a person skilled in the art would have been aware that detecting detection lines corresponding to subsequent multiplexing control switches 202 ($MUX_2$-n) is still within the scope of protection of the present application.

After introducing the method for detecting the detection line using the integration sub-circuit 301 as shown in FIG. 4B, based on the same inventive concept, the method for detecting the detection line using the integration sub-circuit 301 as shown in FIGS. 4C and 4D is as follows: since the processing methods of the two integration sub-circuits in the data writing phase, the reset phase and the capacitance balance phase are the same, the description thereof will not be repeated here, and only the sampling phase will be described in detail below.

As shown in FIG. 4D, the integration sub-circuit 301 comprises a multi-path channel selection switch 408, a plurality of voltage acquisition circuits 407 and a digital-to-analogue conversion circuit 302, wherein the plurality of voltage acquisition circuits 407 comprise at least two voltage acquisition circuits 407 (only two are shown in FIG. 4D), performing multiple sampling on the integrated voltage signal, and determining an output voltage difference between different sampling points comprises:

performing multiple samplings on the integrated voltage signal of the detection line by one voltage acquisition circuit 407 to obtain a plurality of sampling points, and saving the plurality of sampling points; when the remaining voltage acquisition circuits 407 perform current detection on other detection lines, performing multiple samplings on the integrated voltage signals of other detection lines to obtain a plurality of sampling points, and saving the plurality of sampling points; at a specified timing for performing current detection on a next detection line of the detection lines, and controlling the multi-path channel selection switch 408 to turn on a voltage acquisition circuit saving the sampling points of the detection line; and acquiring a plurality of sampling points of the detection line through the multi-path channel selection switch 408, and determining the output voltage difference based on the plurality of sampling points.

In some embodiments, the specified timing is before an integrated voltage signal of a next detection lines is sampled by the integration sub-circuit 301, and after a multiplexing control switch 202 corresponding to the next detection line is in an on state.

For example: as shown in FIG. 4D and FIG. 13, when sampling the detection line 1, at the time point B from the integration start, the integrating control switch $K_1$ is turned on and off, the low noise operational amplifier $OP_1$ in the integrator 401 is in an open loop integration state, the multiplexing control switch 202 (MUX is at a high level as shown in FIG. 13) and the sensing control switch 303 (Sn is at a high level as shown in FIG. 13) are turned on, and the driving current output by the drive transistor $T_1$ under the action of the voltage stored on the storage capacitor $C_{st}$ passes through the sensing control switch 303, the detection line 102, and the multiplexing control switch 202 (MUX) to the integrating capacitor $C_{INT}$. As shown in FIG. 13, the output voltage $V_{OP1}$ of the integrator decreases with time when $K_1$ switches from an on state to an off state. After $t_s$, the output voltage $V_{OP1}$ of the integrator decreases from $V_{int}$ to $V_{1A}$, and the $CDS_{1A}$ of the voltage acquisition circuit 407 turns on to start sampling to obtain the acquired voltage $V_{1A}$, which is stored in the holding capacitor $C_{1A}$. After another T duration, the integrated voltage drops from $V_{1A}$ to $V_{1B}$, and $CDS_{1B}$ of the voltage acquisition circuit 407 turns on, acquiring the voltage $V_{1B}$ and storing same in the holding capacitor $C_{1B}$. After saving a plurality of sampling points of the integrated voltage signal of the detection line 1, the multiplexing control switch 202 between the detection line 1 and the current detection circuit is set to an off state, and the multiplexing control switch 202 between the detection line 2 and the current detection circuit is set to an on state. The detection line 2 is detected and the output voltage $V_{OP1}$ of the integrator decreases with time when $K_1$ switches from an on state to an off state after the capacitance balance phase has ended. After $t_s$, the output voltage $V_{OP1}$ of the integrator decreases from $V_{int}$ to $V_{2A}$, and the $CDS_{2A}$ of the voltage acquisition circuit 407 turns on to start sampling so as to obtain the acquired voltage $V_{2A}$, which is stored in the holding capacitor $C_{2A}$. After another T duration, the integrated voltage drops from $V_{2A}$ to $V_{2B}$, and the $CDS_{2B}$ of the voltage acquisition circuit 407 turns on, acquiring the voltage $V_{2B}$ and storing same in the holding capacitor $C_{2B}$.

The manner of detecting the n detection lines is the same as the above-mentioned process, and the description thereof will not be repeated here, namely, when detecting the next detection line, performing digital-to-analogue conversion on the sampled voltage of the current detection line, thereby improving the detection efficiency.

Based on the same inventive concept, an embodiment of the present disclosure further provides a display apparatus, as shown in FIG. 2, comprising a display panel 200 and the above-mentioned current detection apparatus; wherein the display panel 200 comprises a display area AA and a non-display area NB; the display area AA comprises a plurality of sub-pixels spx and a plurality of detection lines 102 (SL); the non-display area NB includes a predetermined power line; wherein each sub-pixel spx comprises a pixel circuit; A column of pixel circuits is coupled to a detection line 102 (SL); it is to be noted that the coupling manner of the display panel 200 and the current detection apparatus can be referred to the above description will not be described in detail.

In particular implementations, in embodiments of the present disclosure, the display apparatus may be: any product or component with display function such as a mobile phone, a tablet computer, a television, a monitor, a notebook computer, a digital photo frame and a navigator. Other essential components of the display apparatus will be understood by those of ordinary skill in the art and are not described in detail herein and are not intended to limit the present disclosure.

It should be noted that while several circuits or sub-circuits of the apparatus have been mentioned above in the detailed description, such division is merely exemplary and not mandatory. Indeed, the features and functions of two or more circuits described above may be embodied in one circuit in accordance with embodiments of the present disclosure. Conversely, features and functions of one circuit described above may be further subdivided into embodiments by multiple circuits.

Moreover, while the operations of the disclosed methods are depicted in the drawings in a particular order, this does not require or imply that the operations must be performed in the particular order, or that all illustrated operations must be performed, to achieve desirable results. Additionally or alternatively, certain steps may be omitted, multiple steps combined into one step execution, and/or one step decomposed into multiple step executions.

It will be appreciated by those skilled in the art that embodiments of the present disclosure may be provided as a method, system, or computer program product. Accordingly, the present disclosure may take the form of an entirely hardware embodiment, an entirely software embodiment or an embodiment combining software and hardware aspects. Furthermore, the present disclosure may take the form of a computer program product embodied on one or more computer-usable storage media (including, but not limited to, disk storage, CD-ROM, optical storage, etc.) having computer-usable program code embodied therein.

The present disclosure is described with reference to flowchart illustrations and/or block diagrams of methods, devices (systems), and computer program products according to the present disclosure. It will be understood that each flow and/or block of the flowcharts and/or block diagrams, and combinations of flows and/or blocks in the flowcharts and/or block diagrams, can be implemented by computer program instructions. These computer program instructions may be provided to a processor of a general purpose computer, special purpose computer, embedded processor or other programmable data processing device to produce a machine, such that the instructions, which execute via the processor of the computer or other programmable data processing device, create the apparatus for implementing the functions specified in the flowchart flow or flows and/or block diagram block or blocks.

These computer program instructions may also be stored in a computer-readable memory that can direct a computer or other programmable data processing device to function in a particular manner, such that the instructions stored in the computer-readable memory produce an article of manufacture including instruction means which implement the function specified in the flowchart flow or flows and/or block diagram block or blocks.

These computer program instructions may also be loaded onto a computer or other programmable data processing device to cause a series of operational steps to be performed on the computer or other programmable apparatus to produce a computer implemented process such that the instructions which execute on the computer or other programmable apparatus provide steps for implementing the functions specified in the flowchart flow or flows and/or block diagram block or blocks.

It will be apparent to those skilled in the art that various modifications and variations can be made in the present disclosure without departing from the spirit or scope of the disclosure. Thus, it is intended that the present disclosure cover the modifications and variations of this disclosure provided they come within the scope of the appended claims and their equivalents.

What is claimed is:

1. A control method for a current detection apparatus, wherein the apparatus comprises: a plurality of detection circuits, wherein each of the detection circuits is coupled to a detection line in a display panel; the detection line is coupled to a sensing control switch in a pixel circuit, and the method comprises:

controlling the sensing control switch to be in an on state at a first time point before each of the detection circuits performs an integration operation on the detection line; a duration between the first time point and an integration start time point at which each of the detection circuits starts the integration operation being a first duration;

controlling each of the detection circuits to start the integration operation on a current of the detection line at the integration start time point to obtain an integrated voltage signal corresponding to the detection line;

performing multiple samplings on the integrated voltage signal, and determining an output voltage difference between different sampling points; and determining the current of the detection line based on the output voltage difference;

wherein an integration sub-circuit comprises a voltage acquisition circuit and a voltage difference determination circuit, and the performing multiple samplings on the integrated voltage signal, and determining an output voltage difference between different sampling points, comprises:

controlling the voltage acquisition circuit to acquire a first integrated voltage of the integrated voltage signal at a first integrated time point;

controlling the voltage acquisition circuit to acquire a second integrated voltage of the integrated voltage signal at a second integrated time point; and controlling the voltage difference determination circuit to determine a difference between the first integrated voltage and the second integrated voltage as the output voltage difference.

2. The method according to claim 1, wherein a duration between a time point when the integrated voltage signal is sampled for the first time and the integration start time point is a second duration, and the second duration is greater than or equal to a duration for establishing balance, wherein the duration for establishing balance is a duration required for the sensing control switch and each of the detection circuits to establish stable balance with the detection line.

3. The method according to claim 1, wherein the integration sub-circuit is comprised in each of the detection circuits, the integration sub-circuit is configured to perform the integration operation, and before the controlling each of the detection circuits to start the integration operation on a current of the detection line at the integration start time point, the method further comprises:

performing a reset operation on the detection line and the integration sub-circuit.

4. The method according to claim 3, wherein before the performing a reset operation on the detection line and the integration sub-circuit, the method further comprises:

writing a grayscale voltage to a gate electrode of a drive transistor of the pixel circuit; and writing a reference voltage to a source electrode of the drive transistor and the detection line.

5. The method according to claim 3, wherein an integrator is provided in the integration sub-circuit, a second end of the integrator is coupled to the detection line, a first end of the integrator is coupled to an initial voltage end, and the first end of the integrator is coupled to the detection line via a reset circuit, the reset circuit comprises a reset control switch and a follower amplifier, one end of the follower amplifier is coupled to the first end of the integrator, and the other end is coupled to the reset control switch; and the performing a reset operation on the detection line, comprises:

turning on the reset control switch to reset a potential of the detection line and a potential of a source electrode of a drive transistor in the pixel circuit to initial voltages.

6. The method according to claim 3, wherein the integration sub-circuit is provided with an integrator, and the integrator comprises a low noise operational amplifier, an integrating capacitor and an integrating control switch which are arranged in parallel, wherein one end of the integrating capacitor and the integrating control switch is coupled to a second end of the low noise operational amplifier, and the other end is coupled to a third end of the low noise operational amplifier, and a first end of the low noise operational amplifier is coupled to an initial voltage end; and the performing a reset operation on the integration sub-circuit, comprises:

turning on the integrating control switch to clear charges in the integrating capacitor.

7. The method according to claim 3, wherein if each of the detection circuits is coupled to a plurality of detection lines, grayscale voltages are written to pixel circuits respectively corresponding to the plurality of detection lines at a same time; and after completing the writing of the grayscale voltages, simultaneously performing the reset operation on the plurality of detection lines.

8. The method according to claim 7, wherein each detection line is coupled to a multiplexing control switch; one end of the multiplexing control switch is coupled to the detection line, and the other end is coupled to the detection circuit corresponding to the detection line; and after the determining the current of the detection line based on the output voltage difference, the method further comprises:

setting the multiplexing control switch to which the detection line is coupled to an off state, and turning on the multiplexing control switch of a next detection line to detect a current of the next detection line through the detection circuit.

9. The method according to claim 1, wherein the performing multiple samplings on the integrated voltage signal, and determining an output voltage difference between different sampling points, comprises:

forming a sampling point pair from two adjacent sampling points, and determining a voltage difference between the two sampling points in each sampling point pair; and determining an average of the voltage differences of different sampling point pairs as the output voltage difference.

10. The method according to claim 1, wherein after the determining the current of the detection line based on the output voltage difference, the method further comprises:

if the current of the detection line is less than a preset value, then acquiring a compensation current of the detection line; and performing a correction operation on the current of the detection line based on the compensation current.

11. The method according to claim 10, wherein the acquiring a compensation current of the detection line, comprises:

writing a drive voltage to a drive transistor in the pixel circuit; wherein a voltage difference between a gate electrode and a source electrode of the drive transistor of the drive voltage needs to be less than a threshold voltage of the drive transistor; and detecting a current of the detection line by the detection circuit corresponding to the detection line as the compensation current.

12. The method according to claim 2, wherein the first duration is a duration of a capacitance balance phase required for a parasitic load capacitor to establish a stable balance with the pixel circuit and the sensing control switch;

the parasitic load capacitor is a capacitor created between the detection line and crossing lines of different layers.

13. The method according to claim 1, wherein each of the detection circuits is connected to a plurality of detection lines via a plurality of multiplexing control switches, wherein the plurality of detection lines corresponds to the plurality of multiplexing control switches on a one-to-one basis; and the method further comprises:

turning on any one of the multiplexing control switches, and controlling each of the detection circuits to perform current detection on the detection line corresponding to the multiplexing control switch in an on state.

14. The method according to claim 13, wherein the integration sub-circuit comprises a voltage difference determination circuit and a digital-to-analogue conversion circuit, and the current detection apparatus further comprises a controller;

the voltage difference determination circuit is configured to determine the output voltage difference between different sampling points, and sending the output voltage difference to the digital-to-analogue conversion circuit;

the digital-to-analogue conversion circuit is configured to perform digital-to-analogue conversion on the output voltage difference and sending a conversion result to the controller;

the controller is configured to determine a current of the detection line according to the conversion result.

15. The method according to claim 13, wherein the integration sub-circuit further comprises a multi-path channel selection switch and a plurality of voltage acquisition circuits, wherein the plurality of voltage acquisition circuits comprises at least two voltage acquisition circuits; and the performing multiple samplings on the integrated voltage signal, and determining an output voltage difference between different sampling points, comprises:

performing multiple samplings on the integrated voltage signal of the detection line by one voltage acquisition circuit to obtain a plurality of sampling points, and saving the plurality of sampling points; when the remaining voltage acquisition circuits perform current detection on other detection lines, performing multiple samplings on the integrated voltage signals of other detection lines to obtain a plurality of sampling points, and saving the plurality of sampling points;

at a specified timing for performing current detection on a next detection line of the detection lines, controlling the multi-path channel selection switch to turn on a voltage acquisition circuit saving the sampling points of the detection line; and acquiring a plurality of sampling points of the detection line through the multi-path channel selection switch, and determining the output voltage difference based on the plurality of sampling points.

16. The method according to claim 15, wherein after saving the plurality of the sampling points of the integrated voltage signal of the detection line, setting the multiplexing control switch between the detection line and the detection circuit corresponding to the detection line to an off state, and setting the multiplexing control switch between a next detection line of the detection lines and the detection circuit to an on state.

17. The method according to claim 15, wherein the specified timing is before an integrated voltage signal of a next detection line of the detection line is sampled by the integration sub-circuit, and after a multiplexing control switch corresponding to the next detection line is in an on state.

18. A control device for a current detection apparatus, wherein the current detection apparatus comprises: a current detection circuit; the current detection circuit is configured to detect a current of a detection line, the device comprises a processor and a memory;

the memory is configured to store a computer program executable by the processor;

the processor is coupled to the memory and configured to perform the method according to claim 1.

* * * * *